(12) United States Patent
Okamoto et al.

(10) Patent No.: US 7,477,099 B2
(45) Date of Patent: Jan. 13, 2009

(54) FILTER ADJUSTMENT CIRCUIT

(75) Inventors: Kouji Okamoto, Osaka (JP); Takashi Morie, Osaka (JP); Shiro Dosho, Osaka (JP); Hirokuni Fujiyama, Hyogo (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 11/792,081

(22) PCT Filed: Sep. 2, 2005

(86) PCT No.: PCT/JP2005/016119

§ 371 (c)(1),
(2), (4) Date: Jun. 1, 2007

(87) PCT Pub. No.: WO2006/059414

PCT Pub. Date: Jun. 8, 2006

(65) Prior Publication Data

US 2008/0169948 A1    Jul. 17, 2008

(30) Foreign Application Priority Data

Dec. 3, 2004    (JP) ............................. 2004-351637

(51) Int. Cl.
*H03B 1/00* (2006.01)
(52) U.S. Cl. ...................................... 327/553; 327/552
(58) Field of Classification Search ................. None
See application file for complete search history.

(56) References Cited

U.S. PATENT DOCUMENTS 6,262,624 B1 * 7/2001 Tsinker ........................ 327/553

7,245,178 B2 * 7/2007 Kitano ........................ 327/553

FOREIGN PATENT DOCUMENTS

JP        5-291947 A      11/1993

(Continued)

OTHER PUBLICATIONS

Japanese Office Action, with English Translation, issued in Japanese Patent Application No. JP 2006-547653, mailed on Feb. 12, 2008.

*Primary Examiner*—Cassandra Cox
(74) *Attorney, Agent, or Firm*—McDermott Will & Emery LLP

(57) ABSTRACT

In a filter adjustment circuit for an analog filter circuit such as a Gm-C filter, an input signal IS from a reference signal generation circuit 1 is inputted to a Gm-C filter 2 to be filtered and then converted by a conversion circuit 3 to a digital signal. A reference signal RS from the reference signal generation circuit 1 is converted by a conversion circuit 4 to a digital signal. The two converted signals are held in time series in a holding circuit 5. A timing generation circuit 6 generates an update timing signal en based on a reference time-series signal ref from the holding circuit 5. A control signal generation circuit 7 generates a control signal CS based on the reference time-series signal ref and a filter output time-series signal tgt, each from the holding circuit 5. The control signal CS is inputted to the Gm-C filter 2 in response to the update timing signal en to adjust the gain of the Gm-C filter 2. As a result, variations in the response characteristics of the Gm-C filter 2 are adjusted with high accuracy with a simple circuit structure.

23 Claims, 20 Drawing Sheets

FOREIGN PATENT DOCUMENTS

| | | |
|---|---|---|
| JP | 06-209231 A | 7/1994 |
| JP | 8-298438 A | 11/1996 |
| JP | 9-69753 A | 3/1997 |
| JP | 10-256908 A | 9/1998 |
| JP | 10-303699 A | 11/1998 |
| JP | 11-205135 A | 7/1999 |
| JP | 2001-308683 A | 11/2001 |
| JP | 2003-188683 A | 7/2003 |

* cited by examiner

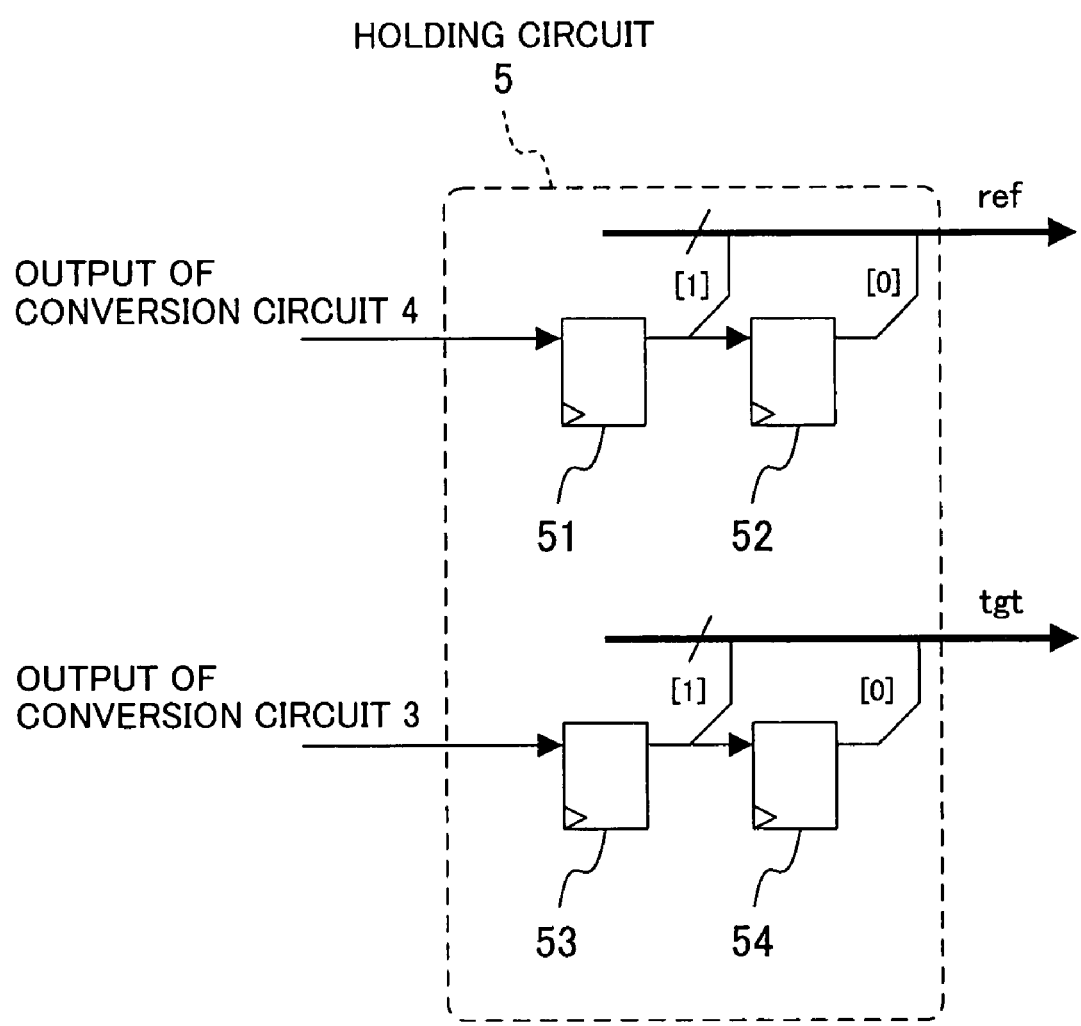

FILTER ADJUSTMENT CIRCUIT

RELATED APPLICATIONS

This application is the U.S. National Phase under 35 U.S.C. § 371 of International Application No. PCT/JP2005/016119, filed on Sep. 2, 2005, which in turn claims the benefit of Japanese Application No. 2004-351637, filed on Dec. 3, 2004, the disclosures of which Applications are incorporated by reference herein.

TECHNICAL FIELD

The present invention relates to a filter adjustment circuit for automatically compensating for variations in the response characteristics of an analog filter resulting from fabrication variations or the like.

BACKGROUND ART

With the progress of CMOS technologies, the development and fabrication of wireless communication LSIs in the GHz band has become possible. The formation of a wireless communication LSI for a Bluetooth system, a wireless LAN, or the like by using a CMOS contributes to the implementation of a lower-cost, lower-power-consumption, and higher-speed system.

In such a system, a continuous-time filter using an analog amplifier such as a transconductance amplifier (Gm amplifier) as an analog filter circuit is used. When such an analog filter circuit is particularly integrated into a CMOS, a transconductance Gm value varies due to variations in the characteristics of a transistor and the time constant of the analog filter circuit greatly varies so that the cutoff frequency of the analog filter circuit or the like shifts on an frequency axis.

Therefore, there has been conventionally proposed a method for performing filter adjustment by using a dummy filter or a dummy oscillator employing the Gm amplifier, which is the component of the analog filter circuit, to adjust the characteristic variations of the analog filter circuit resulting from fabrication variations.

However, in the filter adjustment method described above, such problems as an increase in circuit area, a mismatch between semiconductor elements, and an increase in the number of development steps still remain. To solve these problems, a structure which detects a phase difference between the input/output signals of an analog filter circuit and adjusts an amount of bias for the analog filter circuit is disclosed in, e.g., Patent Document 1.

The conventional filter adjustment circuit based on the detection of the phase difference will be described herein below with reference to FIG. 24. In the drawing, 201 denotes a selector and 202 denotes a Gm-C filter as an analog filter circuit, 203 denotes a multiplier, 204 denotes a filter circuit, 205 denotes a digitization circuit, 206 denotes an up/down counter, 207 denotes a DA conversion circuit for converting a digital amount to an analog amount to generate a bias value.

An operation of the conventional filter adjustment circuit will be described herein below. The description will be given by assuming that the Gm-C filter 202 is a Butterworth Gm-C filter having a fourth-order bandpass characteristic.

In the adjustment of the Gm-C filter 202, the selector 201 is set to input a reference signal to the Gm-C filter 202. As the reference signal, a signal having the center frequency of the Gm-C filter 202 is adopted. Since the phase rotation between the input/output signals at the center frequency is −180° in the fourth-order Butterworth Gm-C filter 202, easy calibration to the center frequency is allowed by adjusting the phase difference between the input/output signals of the Gm-C filter to −180°.

Subsequently, the input/output signals of the Gm-C filter 202 are inputted to the multiplier 203 and a phase error is detected. An output of the multiplier 203 is smoothed by the filter circuit 204 and then converted to digital information by the digitization circuit 205. The up/down counter 206 uses the digital information to count and provide a count value in accordance with a phase lag/lead. An output of the up/down counter 206 is converted to an analog amount by a DA conversion circuit 207 to adjust a bias value for the Gm-C filter 202. When the amount of controlling the transconductance Gm becomes steady, the phase difference between the input/output signals of the Gm-C filter 202 becomes exactly −180°.

Patent Document 1: Japanese Laid-Open Patent Publication No. HEI 10-303699 (pages 1 to 3, FIG. 1).

DISCLOSURE OF THE INVENTION

Problem to be Solved by the Invention

However, the conventional filter adjustment circuit has the drawback of a large circuit scale because the structure thereof uses the multiplier. The conventional filter adjustment circuit also has the drawback that a complicated and high-accuracy structure is required thereof because high accuracy is required of the relationship between the frequency of the reference signal and the cutoff frequency of the filter.

In addition, the conventional filter adjustment circuit also has the drawback of low versatility. This is because the conventional filter adjustment circuit, which uses the multiplier, can perform only a control operation such that the phase difference between the input/output signals of the analog filter circuit becomes ±180° or a value based thereon and, accordingly, the model and type of the analog filter circuit is limited.

The present invention aims at eliminating the drawbacks described above and a first object of the present invention is to provide a filter adjustment circuit capable of performing high-accuracy filter adjustment with a simple circuit structure without using a multiplier and requiring high accuracy of the relationship between the frequency of a reference signal and the cutoff frequency of an analog filter circuit.

In addition to the first object described above, a second object of the present invention is to provide a filter adjustment circuit capable of performing easy filter adjustment not only for an analog filter circuit of which the input/output signals have a phase difference of ±180° therebetween but also for an analog filter circuit of which the input/output signals have other variable phase differences therebetween.

Means for Solving the Problems

To attain the first object described above, the present invention adjusts the gain of an analog filter circuit such that changes in the respective states of an output signal of an analog filter and a reference signal have a temporally predetermined phase relationship therebetween by performing digitization or value multiplexing to each of the two signals and holding the two signals in times series.

Specifically, a filter adjustment circuit of the present invention is a filter adjustment circuit for adjusting response characteristics of an analog filter circuit having an analog amplifier capable of variably adjusting a gain in accordance with a value of a control signal inputted to a control terminal, the filter adjustment circuit comprising: reference signal generating means for generating an input signal to be inputted to the analog filter circuit and a reference signal as a comparison target and outputting the input signal and the reference signal; converting means for converting an output signal from the analog filter circuit operating on receiving the input signal and the reference signal from the reference signal generating means to signals in accordance with respective amplitude values of these signals; holding means for holding the two output signals from the converting means in time series; timing generating means for generating an update timing signal indicative of an update timing of the control signal to be inputted to the control terminal of the analog filter circuit based on a state transition of a filter output time-series signal held in the holding means or on a state transition of a reference time-series signal held in the holding means; and a control signal generating means for receiving the filter output time-series signal and the reference time-series signal each held in the holding means as well as the update timing signal from the timing generating means, generating the control signal to be inputted to the control terminal of the analog filter circuit based on a state of the received filter output time-series signal and on a state of the received reference time-series signal, and outputting the control signal to the analog filter circuit in accordance with a reception timing of the update timing signal.

In the filter adjustment circuit of the present invention, the reference signal generating means comprises a frequency division circuit for receiving a predetermined reference signal and dividing a frequency of the reference signal to generate the input signal to the analog filter circuit and the reference signal as the comparison target.

To attain the second object described above, in the filter adjustment circuit of the present invention, the reference signal generating means comprises a delay circuit disposed in either of the input signal to the analog filter circuit and the reference signal as the comparison target to delay the input signal or the reference signal by a predetermined phase.

In the filter adjustment circuit of the present invention, the reference signal generating means comprises an intermittent circuit for receiving a specified reference signal and intermitting the reference signal for a predetermined time to generate the intermittent input signal to the analog filter and the intermittent reference signal as the comparison target.

In the filter adjustment circuit of the present invention, the reference signal generating means comprises a waveform shaping circuit for receiving a specified reference signal and delaying a change in the reference signal to generate the input signal to the analog filter circuit showing the delayed change as well as the reference signal as the comparison target showing the delayed change.

In the filter adjustment circuit of the present invention, the reference signal generating means generates the input signal to the analog filter circuit and the reference signal as the comparison target as identical signals.

In the filter adjustment circuit of the present invention, the reference signal generating means comprises at least two of the frequency division circuit of claim 2, the delay circuit of claim 3, the intermittent circuit of claim 4, and the waveform shaping circuit of claim 5.

In the filter adjustment circuit of the present invention, the analog filter circuit has only a predetermined part of a filter portion thereof used during the adjustment of the response characteristics thereof.

In the filter adjustment circuit of the present invention, the converting means digitizes each of the output signal from the analog filter circuit and the reference signal and outputs the digitized output signal and the digitized reference signal.

In the filter adjustment circuit of the present invention, the converting means quantizes and converts each of the output signal from the analog filter circuit and the reference signal to a multi-value signal and outputs the multi-value signals.

In the filter adjustment circuit of the present invention, the holding means holds each of a time-series signal in accordance with the amplitude value of the output signal from the analog filter circuit held in the converting means and a time-series signal in accordance with the amplitude value of the reference signal from the reference signal generating means at 2 or more points.

In the filter adjustment circuit of the present invention, the timing generating means detects a rising edge of the reference time-series signal held in the holding means and generates the update timing signal upon detecting the rising edge.

In the filter adjustment circuit of the present invention, the timing generating means detects a falling edge of the reference time-series signal held in the holding means and generates the update timing signal upon detecting the falling edge.

In the filter adjustment circuit of the present invention, the timing generating means detects rising edges and falling edges of the reference time-series signal held in the holding means and generates the update timing signal upon detecting each of the rising edges and the falling edges.

In the filter adjustment circuit of the present invention, the timing generating means detects a rising edge of the filter output time-series signal held in the holding means and generates the update timing signal upon detecting the rising edge.

In the filter adjustment circuit of the present invention, the timing generating means detects a falling edge of the filter output time-series signal held in the holding means and generates the update timing signal upon detecting the falling edge.

In the filter adjustment circuit of the present invention, the timing generating means detects rising edges and falling edges of the filter output time-series signal held in the holding means and generates the update timing signal upon detecting each of the rising edges and the falling edges.

In the filter adjustment circuit of the present invention, the timing generating means comprises generation cycle setting means for setting a generation cycle of the update timing signal to an arbitrary given cycle.

In the filter adjustment circuit of the present invention, the control signal generating means updates the control signal to be inputted to the control terminal of the analog filter circuit on each reception timing of the update timing signal from the timing generating means.

In the filter adjustment circuit of the present invention, the control signal generating means changes a gain of the control signal to be generated in accordance with the number of times the update timing signal is outputted from the timing generating means.

In the filter adjustment circuit of the present invention, the control signal generating means provides a predetermined time zone including a reception time of the update timing signal from the timing generating means as an insensitive zone in at least one of the two time-series signals received from the holding means and excludes a time-series signal value included in the insensitive zone from a subject based on which the generation of the control signal is determined.

In the filter adjustment circuit of the present invention, each or any of the converting means, the holding means, the timing generating means, and the control signal generating means operates in response to a clock signal and a frequency of the clock signal is sufficiently higher than a frequency of the output signal from the analog filter circuit to ensure a low noise property.

In the filter adjustment circuit of the present invention, the converting means receives a signal extracted from a predetermined internal node in the analog filter circuit as a reference signal instead of receiving the reference signal generated by the reference signal generating means.

Thus, in the present invention, each of the output signal from the analog filter circuit and the reference signal as the target of comparison with the output signal is converted to the signal in accordance with the amplitude value by the converting means and then held in time series by the holding means. When the timing generating means generates the update timing signal based on the state transition of, e.g., the reference time-series signal held in the holding means at the time at which, e.g., the phase of the reference signal changes from a negative value to a positive value, the control signal generating means recognizes the phase relationship between the output signal from the analog filter circuit and the reference signal based on the state of the filter output time-series signal relative to the reference time-series at this time and generates the control signal such that the two signals have a predetermined phase relationship of, e.g., −180° therebetween. On receiving the control signal, the analog filter circuit changes the gain in an increase or decrease direction in accordance with an amount of control indicated by the control signal. As a result, the phase of the output signal from the analog filter approaches a predetermined phase relationship of, e.g., −180° with the reference signal and, through the repetition of the operation described above, the predetermined phase relationship is finally established.

Since the phase relationship between the output signal from the analog filter circuit and the reference signal is recognized based on the reference time-series signal and the filter output time-series signal, it is unnecessary to require high accuracy, as is required conventionally, of the relationship between the frequency of the reference signal and the cutoff frequency of the analog filter. In addition, a multiplier used conventionally is not used. As a result, the filter adjustment circuit according to the present invention has a simpler circuit structure and a reduced circuit scale, while it can also perform high-accuracy adjustment of the characteristics of the analog filter circuit to desired characteristics.

In the present invention, in particular, the delay circuit for delaying either one of the input signal to the analog filter circuit and the reference signal by a predetermined phase is provided. Accordingly, when the phase difference between the input/output signals of the analog filter circuit to which a signal having a target frequency is inputted is a predetermined phase difference α, the characteristics of the analog filter circuit can be adjusted to the desired characteristics with high accuracy by merely delaying the phase by (180°-α) in the delay circuit. Therefore, the present invention is not only applicable to an analog filter circuit in which a multiplier is used conventionally and the phase difference between the input/output signals is ±180° but is also widely applicable to numerous types of analog filter circuits.

Additionally, in the present invention, the phase relationship between the input signal to the analog filter circuit and the reference signal is distinctly defined in advance by intermitting each of the input signal and the reference signal for the predetermined time. Accordingly, even when the analog filter circuit to which the signal having the target frequency is inputted is a high-order analog filter circuit in which the phase difference between the input/output signals thereof is not less than −360°, the characteristics of the filter circuit can be adjusted to the desired characteristics.

Further, in the present invention, the generation cycle of the update timing signal is set to an arbitrary given cycle by the generation cycle setting means. Accordingly, even when a variation occurs in the output signal from the analog filter circuit immediately after the gain of the analog filter circuit is changed, the misoperation of the filter adjustment circuit can be reliably prevented by setting the generation cycle such that the update timing signal is generated after the variation disappears and the steady state is reached.

Additionally, in the present invention, the control signal generating means changes the gain of the control signal to be generated in accordance with the number of times the update timing signal is outputted. For example, when the amount of control of the control signal is set large at first to become smaller as the number of times the update timing signal is outputted increases, the characteristics of the analog filter circuit as the target of adjustment can be adjusted to be closer to the desired characteristics at an early stage and then become the desired characteristics with accuracy after they become closer to the desired characteristics.

In the generation of the control signal by the control signal generating means in the present invention, noise is likely to be mixed in the filter output time-series signal when the update timing signal is outputted, i.e., when, e.g., the phase of the reference signal changes from a negative value to a positive value. However, since the insensitive zone is provided in the filter output time-series signal in this situation and the control signal is generated based on the surrounding filter output time-series signal except for the insensitive zone, it is possible to adjust the characteristics of the analog filter circuit to the desired characteristics with accuracy by suppressing the influence of noise.

Effect of the Invention

Thus, the filter adjustment circuit according to the present invention allows high-accuracy filter adjustment to be performed with a small-scale circuit having a simple circuit structure without using a multiplier and requiring high accuracy of the relationship between the frequency of a reference signal and the cutoff frequency of an analog filter.

In particular, the present invention is not only applicable to an analog filter circuit in which the phase difference between the input/output signals is ±180° but also widely applicable to numerous types of analog filter circuits.

BRIEF DESCRIPTION OF THE DRAWINGS

FIG. 3 show frequency characteristics when the Gm-C filter of FIG. 2 has variations, of which

FIG. 4 show the input/output characteristics of the Gm-C filter of FIG. 2, of which

FIG. 5 is a structural view of a holding circuit provided in the filter adjustment circuit of FIG. 1;

Figure 1:
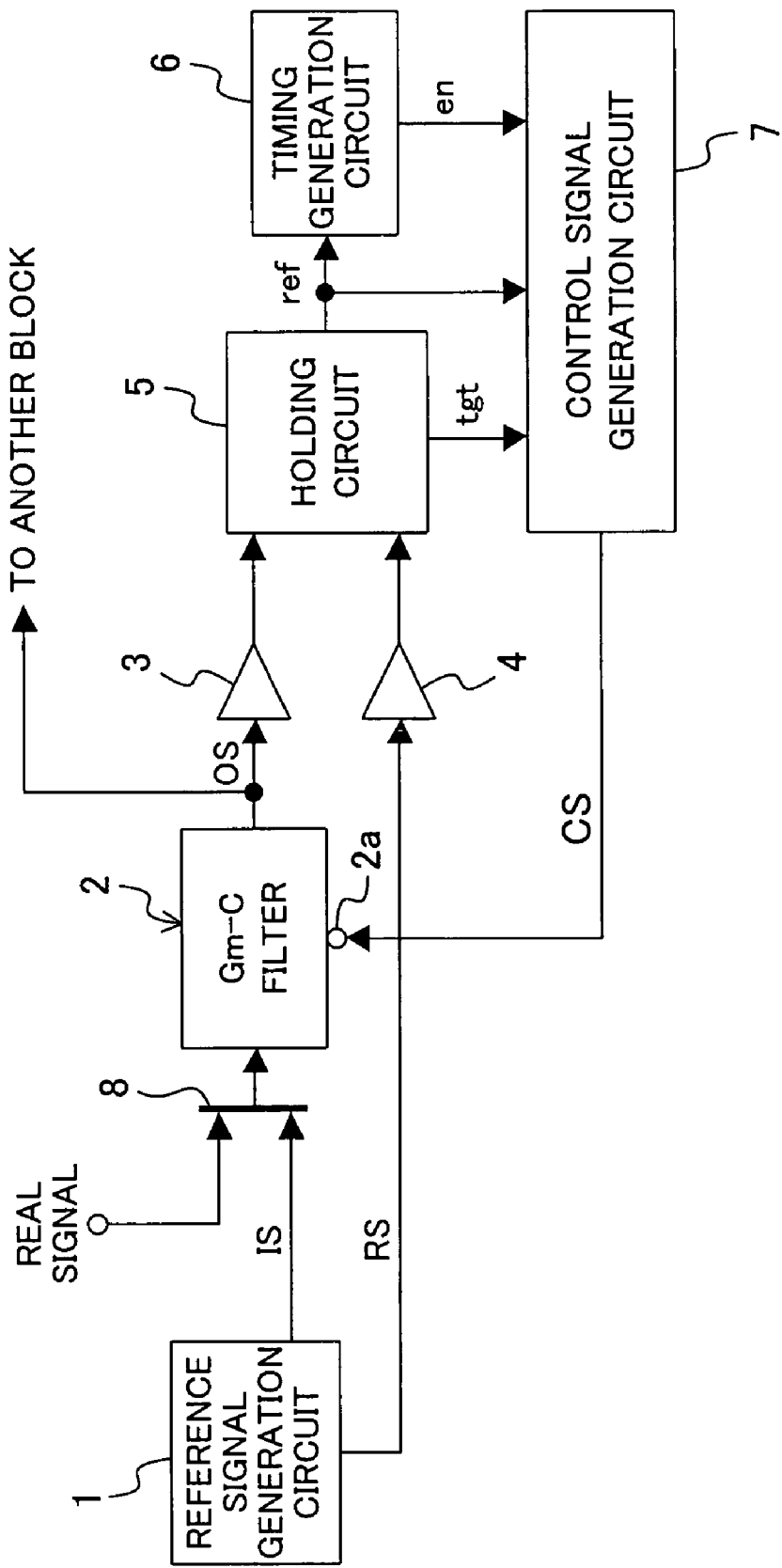
FIG. 1 is an overall structural view of a filter adjustment circuit in Embodiment 1 of the present invention.

DESCRIPTION OF NUMERALS 1, 11, 12, 13 Reference Signal Generation Circuits
  (Reference Signal Generating Means)
2, 21 to 26 Gm-C Filters (Analog Filter Circuits)
3, 4, 205 Conversion Circuits (Converting Means)
5 Holding Circuit (Holding Means)
6, 16 Timing Generation Circuits
  (Timing Generating Means)
7, 17, 117 Control Signal Generation Circuits
  (Control Signal Generating Means)
8, 72, 73, 201 Selectors
25 Transformation Unit
51-59, 151-155 Registers
61, 171 Edge Detection Circuits
62 Edge Selection Circuit
63 Edge Count Circuit
  (Generation Cycle Setting Means)
71 Increase/Decrease Direction Determination Circuit
74 Adder
75 Control Amount Holding Block
76, 207 DA Conversion Circuits
78 Subtractor
79, 173 Counters
111 Reference Signal Generation Circuit
112 Frequency Division Circuit
113 Delay Circuit
114 Open/Close Circuit (Intermittent Circuit)
115, 204 Filter Circuits (Waveform Shaping Circuits)
172 Gain Adjustment Unit
ref Reference Time-Series Signal
tgt Filter Output Time-Series Signal

BEST MODE FOR CARRYING OUT THE INVENTION

Referring to the drawings, filter adjustment circuits according to the embodiments of the present invention will be described herein below. The embodiments shown herein are only illustrative of the present invention and the present invention is not necessarily limited to the embodiments.

EMBODIMENT 1

FIG. 1 shows a structure of the filter adjustment circuit in the first embodiment of the present invention.

In the drawing, 1 denotes a reference signal generation circuit and 2 denotes a Gm-C filter (analog filter circuit) as a target of filter adjustment. The reference signal generation circuit (reference signal generating means) 1 mentioned above generates and outputs an input signal IS inputted to the Gm-C filter 2 inputted during an early learning period and a reference signal RS as a comparison target. The Gm-C filter 2 mentioned above includes a single or a plurality of Gm amplifiers (analog amplifiers) connected to each other, though the internal structure thereof is not shown. 8 denotes a selector for selecting the input signal IS from the reference signal generation circuit 1 during the early learning period and then selecting a real signal in a normal operation after early learning ends.

3 denotes a conversion circuit (converting means) for digitizing an output signal OS from the Gm-C filter 2 mentioned above and outputting the digitized output signal OS, 4 denotes a conversion circuit (converting means) for digitizing the reference signal RS from the reference signal generation circuit 1 and outputting the digitized reference signal RS, and 5 denotes a holding circuit (holding means) for holding the digitized signals from the two conversion circuits 3 and 4 in time series.

Additionally, 6 denotes a timing generation circuit (timing generating means) for generating and outputting an update timing signal en for updating an amount of control on the Gm-C filter 2 based on the transition state of a time-series signal (hereinafter referred to as a reference time-series signal) of the digitized reference signal RS held in the holding circuit 5.

Additionally, 7 denotes a control signal generation circuit (control signal generating means) which receives the update timing signal en from the timing generation circuit 6, also receives the reference time-series signal ref from the holding circuit 5 as well as a time-series signal (hereinafter referred to as a filter output time-series signal) tgt of the digitized filter output signal OS held in the holding circuit 5, generates a control signal CS for adjusting the transconductance Gm value (gain) of the Gm-C filter 2 mentioned above based on the respective state transitions of the reference time-series signal ref and the filter output time-series signal tgt, and outputs the control signal CS to the control terminal 2a of the Gm-C filter 2 mentioned above in response to the reception timing of the update timing en. The Gm-C filter 2 adjusts the gain in accordance with the amount of control (Gm value) of the control signal CS inputted to the control terminal 2a thereof.

Next, a more detailed description will be given to a detailed structure of the filter adjustment circuit of the present embodiment, while giving a description to the operation thereof. For easier description, it is assumed that the Gm-C filter 2 is a fourth-order Butterworth lowpass filter. In the Butterworth structure, the phase rotation between input/output signals when a signal having a cutoff frequency fc is inputted is −180°.

Figure 2:
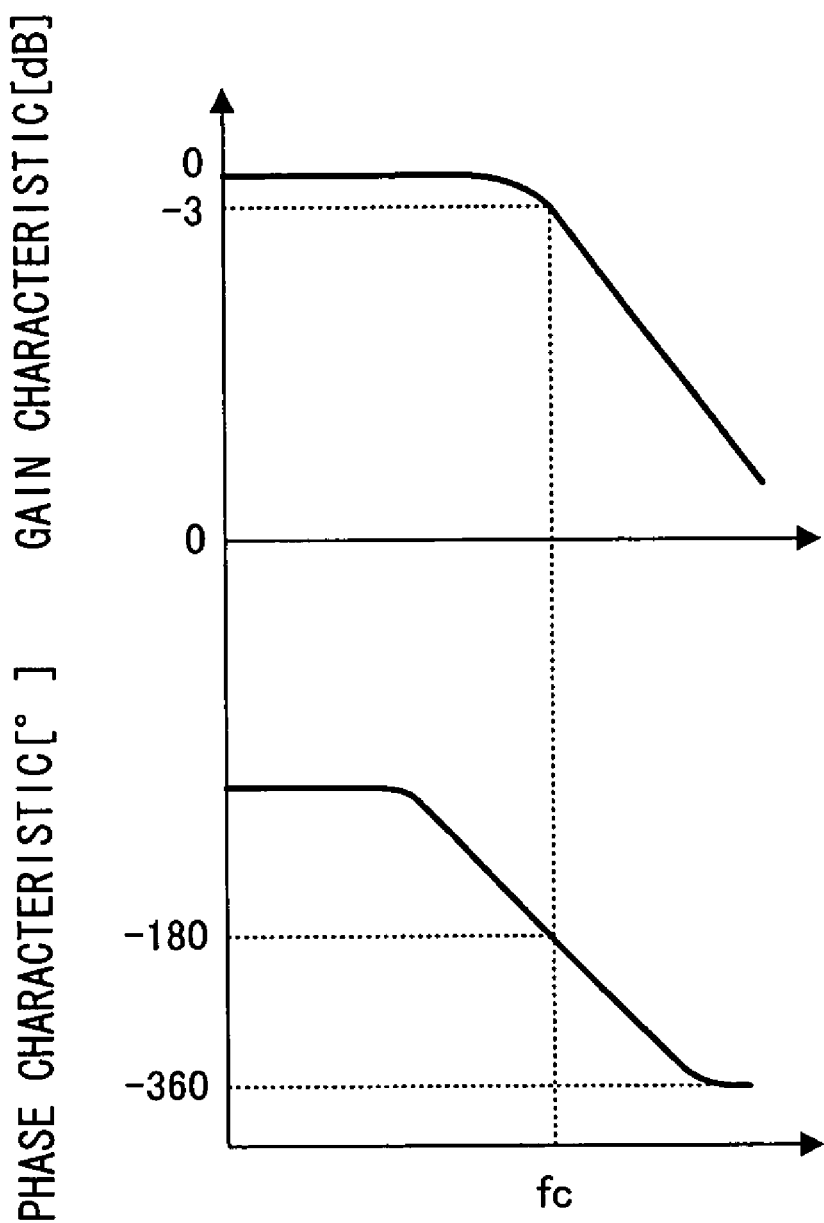
FIG. 2 is a view showing the ideal frequency characteristics of a Gm-C filter as a target of adjustment by the filter adjustment circuit of FIG. 1.
Figure 3A:
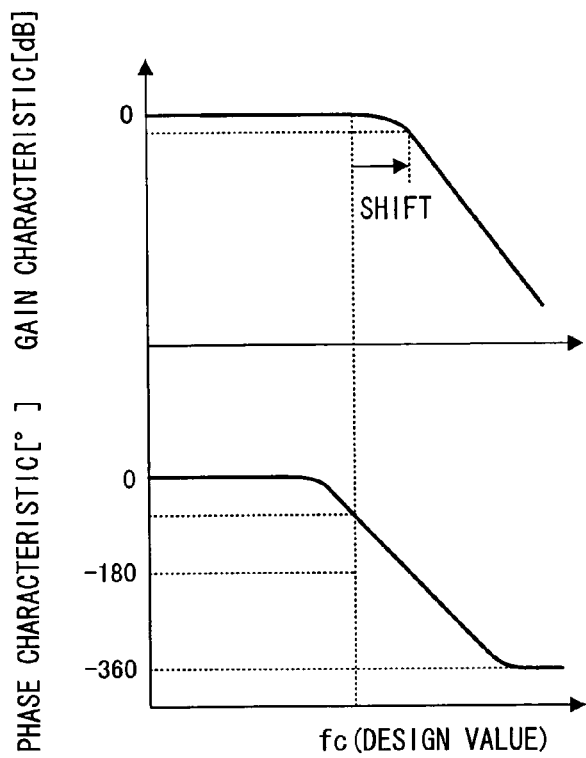
FIG. 3(a) is a view showing the case where a cutoff frequency fc shifts on a frequency axis in the plus direction and FIG. 3(b) is a view showing the case where the cutoff frequency fc shifts on the frequency axis in the minus direction.
Figure 3B:
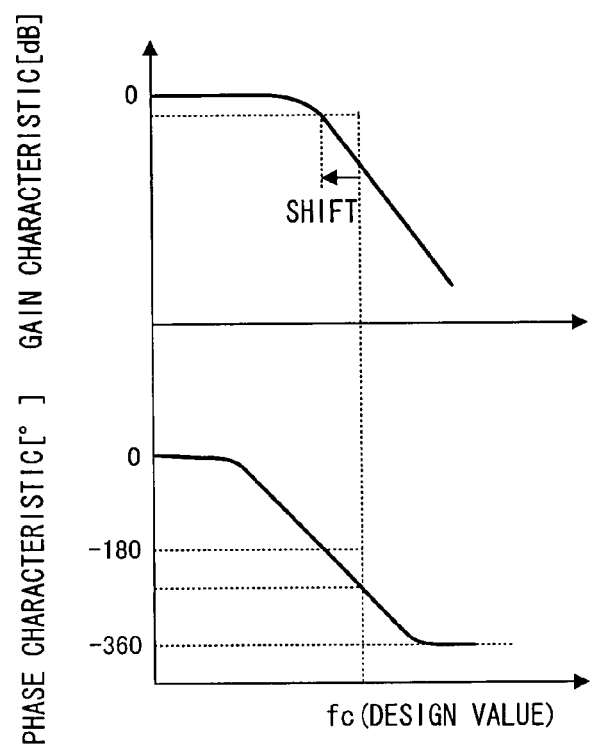

FIG. 2 shows the ideal response characteristics (gain characteristic and phase characteristic) of the Gm-C filter 2 in the present embodiment. In general, the cutoff frequency fc of the Gm-C filter 2 is directly proportional to the transconductance Gm and inversely proportional to a capacitance value C of an internal capacitance thereof. Although the response characteristics shown in FIG. 2 are shown in an ideal case, the response characteristics in an actual case are affected by fabrication process variations and the like so that, as shown in FIGS. 3(a) and 3(b), the value of the cutoff frequency fc shifts on a frequency axis. Since the value of the cutoff frequency fc is directly proportional to the transconductance Gm, it is necessary to decrease the value of the transconductance Gm when the shift is in the plus direction of FIG. 3(a) and increase the value of the transconductance Gm when the shift is in the minus direction of FIG. 3(b).

Therefore, the adjustment of the transconductance Gm value of the Gm-C filter 2 is performed by using the characteristic that the phase difference between the input/output signals of the Gm-C filter 2 is −180° when the frequency of the input signal IS of the Gm-C filter 2 is the cutoff frequency fc.

First, settings are made to switch the selector 8 to the reference signal generation circuit 1 during the early learning period and thereby select the input signal IS generated by the reference signal generation circuit 1 as the input signal of the Gm-C filter 2. At this time, the reference signal generation circuit 1 properly divides the frequency of a reference clock signal inside or outside the system to generate the input signal IS having the cutoff frequency fc. The reference signal generation circuit 1 outputs a signal identical to the foregoing input signal IS having the cutoff frequency fc to be generated as the reference signal RS.

Figure 4A:
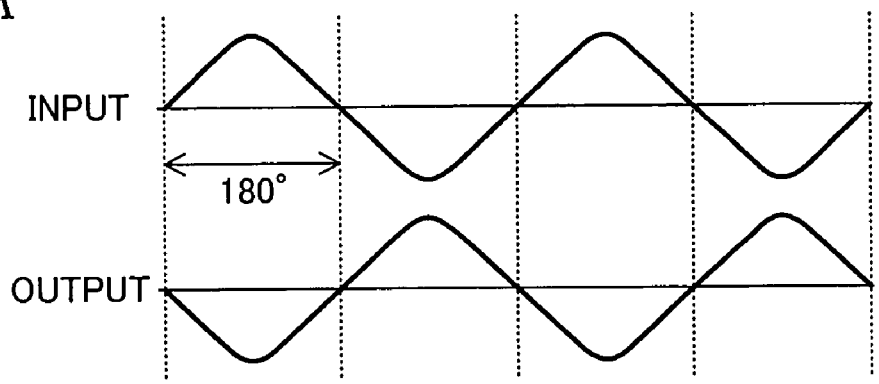
FIG. 4(a) shows the ideal characteristics.
Figure 4B:
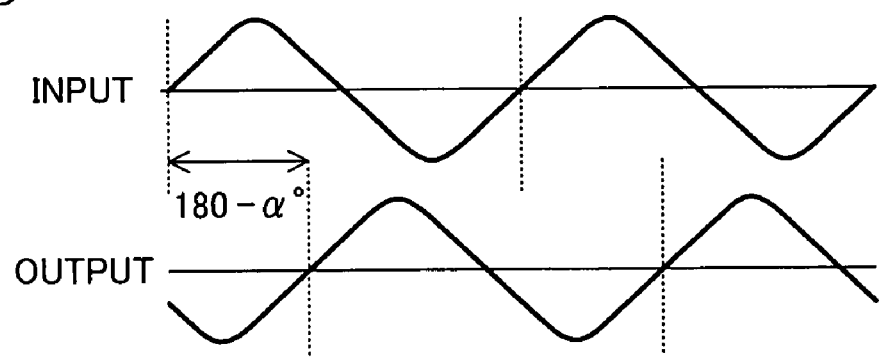
FIG. 4(b) shows the case where a leading phase shift α has occurred relative to −180°.
Figure 4C:
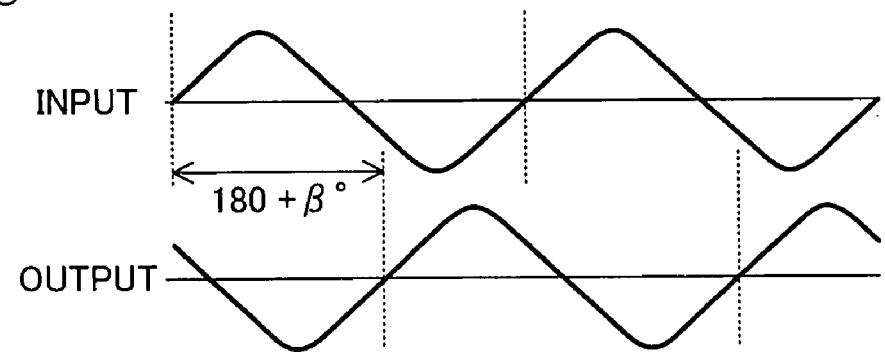
FIG. 4(c) shows the case where a lagging phase shift β has occurred relative to 31 180°.

As shown in FIGS. 3(a) and 3(b), in the case where the cutoff frequency fc of the Gm-C filter 2 varies from a design value, when the input signal IS having the cutoff frequency fc is inputted to the Gm-C filter 2, a phase lead of α° relative to −180° or a phase lag of β° relative to −180° occurs in the input/output characteristics of the Gm-C filter 2 as shown in FIG. 4(b), in contrast to the ideal case shown in FIG. 4(a) where, i.e., a filter coefficient (transconductance Gm value) is proper. In detecting the state of the phase shift, it is effective to convert each of the output signal OS of the Gm-C filter 2 and the reference signal RS as the comparison target to digital information sets and make a comparison therebetween in a digital region. In the present embodiment, the conversion circuits 3 and 4 are used as digitization circuits. These digitization circuits are implemented by comparators, slicers, and the like.

As the holding circuit 5 for holding the respective output signals of the foregoing conversion circuits 3 and 4 in time series, a shift register shown in FIG. 5 is used. In the holding circuit 5 of FIG. 5, 51 to 54 denote 1-bit registers. The output signal of the Gm-C filter 2 digitized by the conversion circuit 3 and the reference signal are stored in respective 2-bit shift registers (51, 52) and (53, 54). From the reference time-series signal ref and the filter output time-series signal tgt obtained in the shift registers 51 to 54, the two transition states from negative values to positive values of the output signal OS of the Gm-C filter 2 and the reference signal RS are detected.

Figure 6:
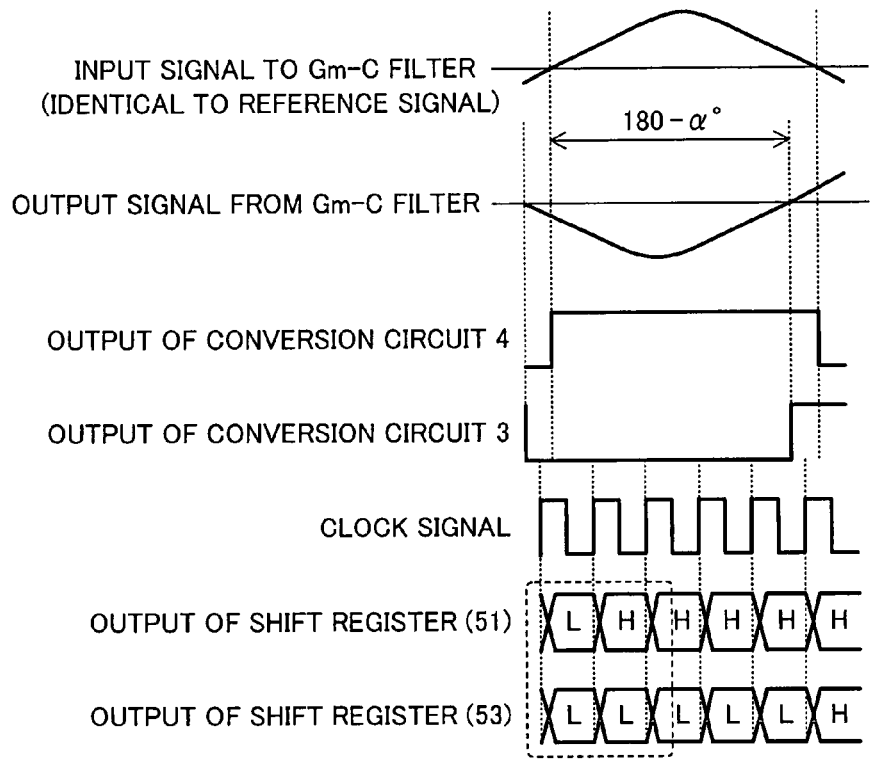
FIG. 6 shows an operation timing chart for the individual portions of the filter adjustment circuit of FIG. 1.

The frequency of a clock signal for driving the conversion circuits 3 and 4 and the digital circuits subsequent thereto is set to a value sufficiently higher than the cutoff frequency fc of the output signal OS of the Gm-C filter 2 to ensure a low noise property. When consideration is given to the state where the phase of the output signal OS of the Gm-C filter 2 is leading the ideal value due to fabrication variations, it is possible to recognize the state transition of the reference signal RS and the state transition of the output signal OS of the Gm-C filter 2 based on the respective state transitions of the two shift registers 51 and 53, as shown in FIG. 6.

Figure 7:
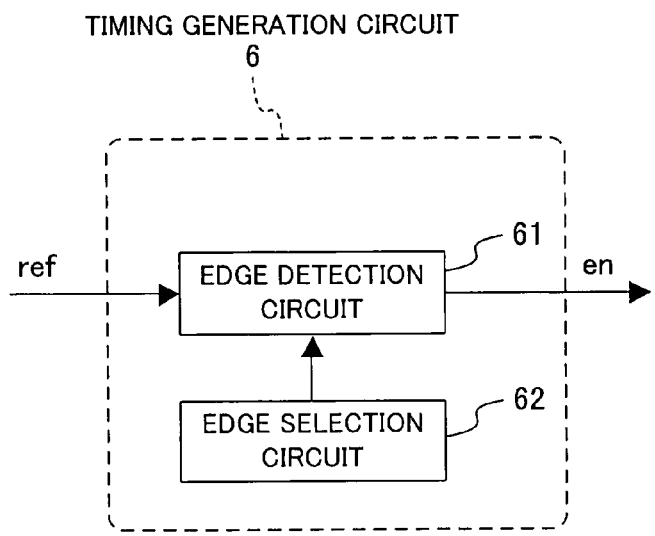
FIG. 7 is a structural view of a timing generation circuit provided in the filter adjustment circuit of FIG. 1.

The timing generation circuit 6 of FIG. 1 generates the update timing signal en for the control signal CS given to the control terminal 2a of the Gm-C filter 2 based on the reference time-series signal ref[1:0] stored in the shift registers 51 and 52 shown in FIG. 5 as a reference. FIG. 7 shows a block diagram of the timing generation circuit 6. In the timing generation circuit 6 of FIG. 7, 61 denotes an edge detection circuit for detecting an edge of the reference time-series signal ref and 62 denotes an edge selection circuit for selecting which one or both of the rising edge and falling edge of the reference time-series signal ref are to be used. For example, when the timing generation circuit 6 is operated on each of the rising edge and falling edge of the reference time-series signal ref, the update timing signal en is generated at each of the state transitions of the reference time-series signal ref from the L level to the H level and from the H level to the L level.

Figure 9:
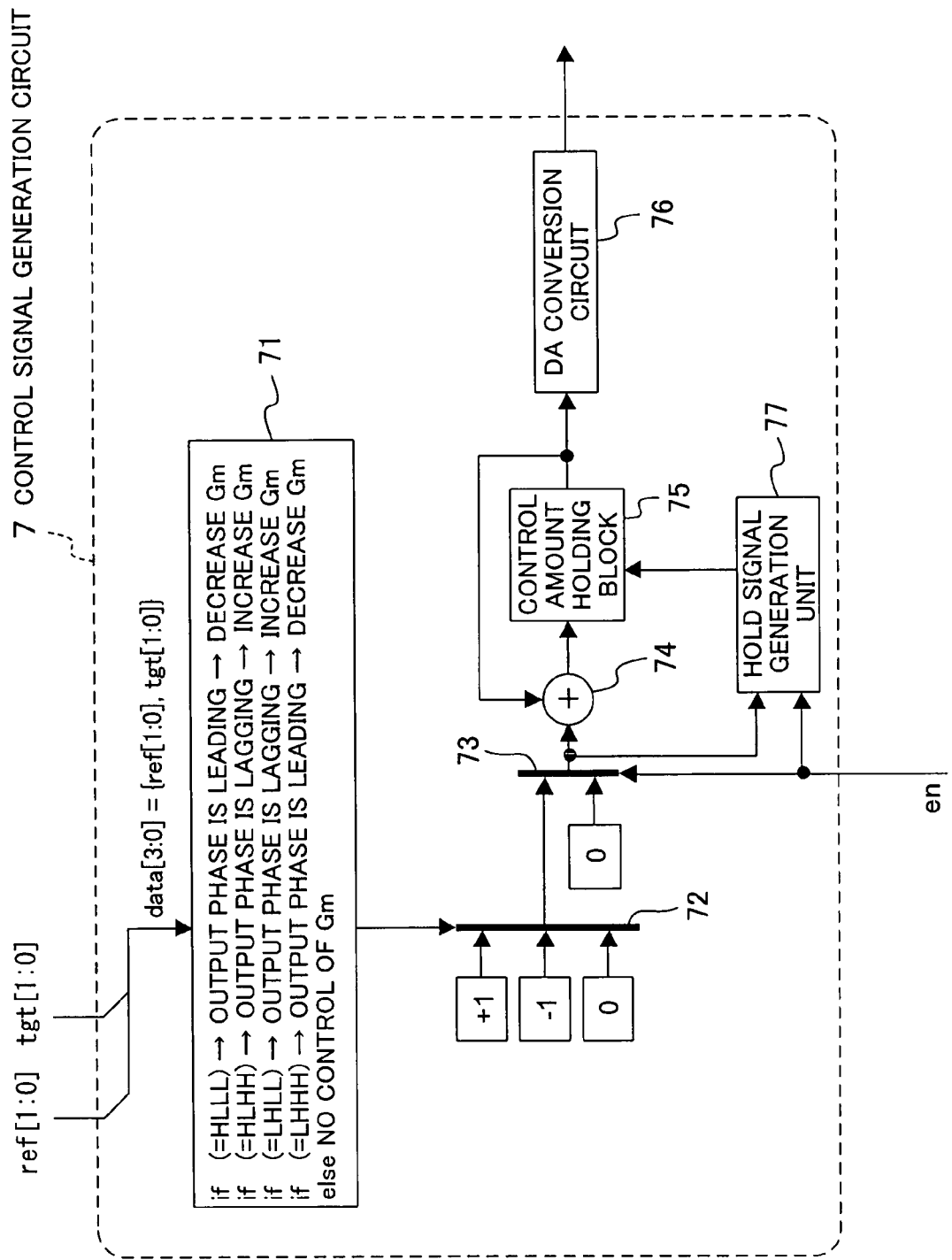
FIG. 9 is a structural view of a control signal generation circuit provided in the filter adjustment circuit of FIG. 1.

The control signal generation circuit 7 of FIG. 1 generates the amount of controlling the transconductance Gm value from the states of the shift registers 51 to 54 of the holding circuit 5 on the reception timing of the update timing signal en outputted from the timing generation circuit 6. FIG. 9 shows a block diagram of the control signal generation circuit 7. In the control signal generation circuit 7 of FIG. 9, 71 denotes an increase/decrease direction determination circuit for determining the increase/decrease direction of the amount of controlling the transconductance Gm value based on the reference time-series signal ref and the filter output time-series signal tgt each from the holding circuit 5, 72 denotes a first selector for selecting any of the update value "+1", "−1", and "0" for the amount of control on the Gm-C filter 2 based on an output of the increase/decrease direction determination circuit 71, 73 denotes a second selector for receiving the update timing signal en from the timing generation circuit 6 mentioned above and selecting either of an output of the first selector 72 and "0", 74 denotes an adder, and 75 denotes a control-amount holding block for storing a digital value of the amount of control on the Gm-C filter 2. The amount of control held by the control-amount holding block 75 is added to the next update value in the adder 74. 76 denotes a DA conversion circuit for converting the amount of control having the digital value held by the control-amount holding block 75 to an analog amount and outputting the analog amount as the amount of control on the Gm-C filter 2. The output of the DA conversion circuit 76 is inputted as the control signal CS to the control terminal 2a of the Gm-C filter 2. Additionally, 77 denotes a hold signal generation unit for receiving the update timing signal en as well as the selected output of the second selector 73, generating a hold signal when the value "0" is consecutively outputted from the selector 73 a plurality of times by determining that learning is completed, and outputting the hold signal to the control-amount holding block 75 to fix the amount of control.

In the control signal generation circuit 7 of FIG. 9, when ref[1:0]={H, L} is satisfied in the reference time-series signal (2-bit system) ref[1:0] and in the filter output time-series signal (2-bit system) tgt[1:0] each from the holding circuit 5, the increase/decrease direction determination circuit 71 mentioned above indicates the rising edge of the reference signal RS and shows the falling edge when ref[1:0]={L, H} is satisfied. When tgt[1:0]={L, L} is satisfied on the rising edge of the reference signal RS, the situation is such that the phase of the output signal OS of the Gm-C filter 2 is leading the design value of −180°. Accordingly, it is necessary to perform a process for decreasing the transconductance Gm value and delaying the phase. Conversely, when tgt[1:0]={H, H} is satisfied, the situation is such that the phase of the output signal OS of the Gm-C filter 22 is lagging behind the design value of −180°. Therefore, the process of increasing the transconductance Gm value and advancing the phase is performed. Likewise, when tgt[1:0]={L, L} is satisfied on the falling edge of the reference signal RS, the situation is such that the phase of the output signal OS from the Gm-C filter 2 is lagging behind the design value of −180°. Accordingly, it is necessary to perform a process for increasing the transconductance Gm value and advancing the phase. Conversely, when tgt[1:0]={H, H} is satisfied, the situation is such that the phase of the output signal OS of the Gm-C filter 2 is leading the design value of −180°. Therefore, the process of decreasing the transconductance Gm value and delaying the phase is performed.

Figure 10:
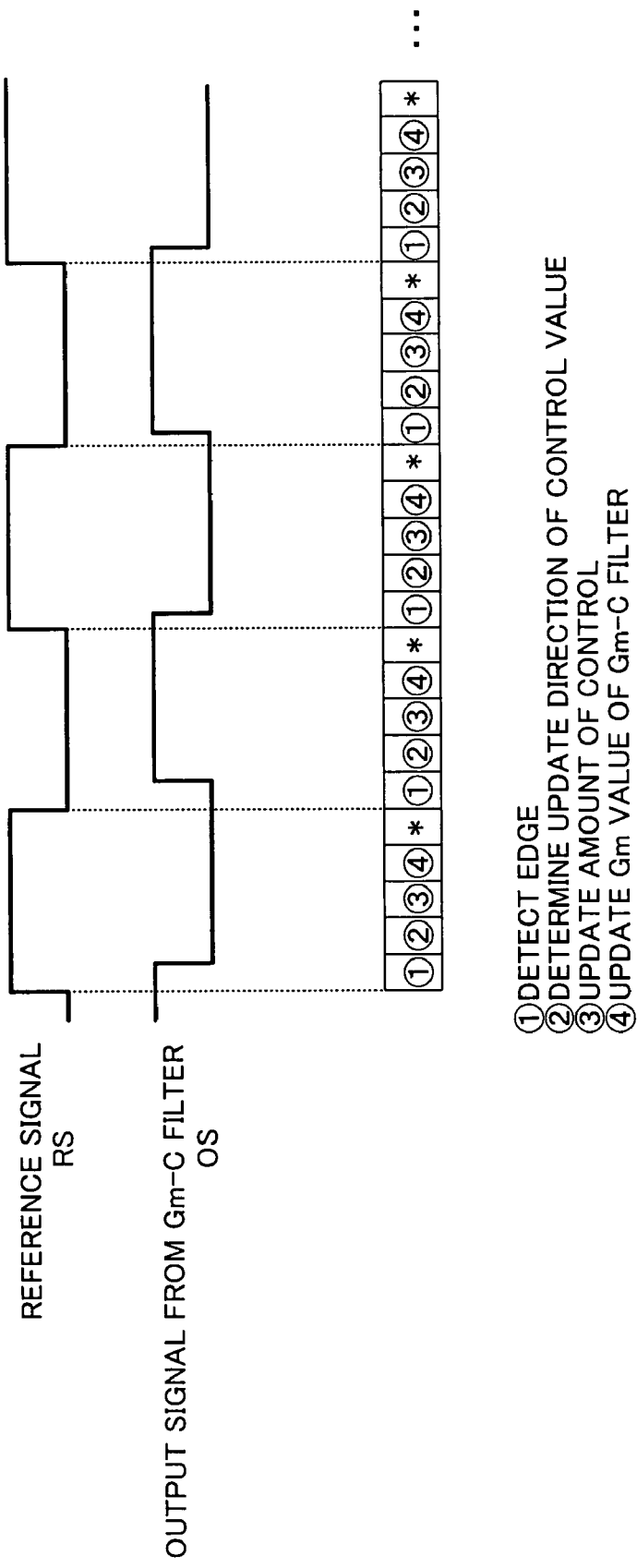
FIG. 10 shows an operation timing chart for the control signal generation circuit of FIG. 9.

That is, as shown in FIG. 9, the increase/decrease direction determination circuit 71 controls the first selector 72 such that it selects "+1" or "−1" to decrease the transconductance Gm value when the combination of the reference time-series signal ref[1:0] and the filter output time-series signal tgt[1:0] is {H, L, L, L}, increase the Gm value when the combination thereof is {H, L, H, H}, increase the Gm value when the combination thereof is {L, H, L, L}, and decrease the Gm value when the combination thereof is {L, H, H, H} and that it selects "0" in the case where the combination thereof is other than the above. Thus, as shown in the timing chart of FIG. 10, the increase/decrease direction determination circuit 71 is constructed to firstly detect edge information on the reference signal RS from the state of the reference time-series signal ref[1:0] from holding circuit 5, secondly detect the direction of control of the transconductance Gm from the state of the filter output time-series signal tgt[1:0] when the edge information is detected, thirdly selects the amount of update "+1", "−1", or "0" by using the selector 72 and adds the amount of update to the previous amount of control in the adder 74 to update the amount of control, and fourthly outputs the control signal CS indicative of the amount of control to the control terminal 2a of the Gm-C filter 2 to update the transconductance Gm value of the Gm-C filter 2.

As can be seen from the foregoing, the present embodiment can reduce the circuit scale since it does not use a multiplier as is used conventionally. In addition, since the increase/decrease direction of the amount of control is determined by recognizing the phase relationship between the output signal from the analog filter circuit and the reference signal based on the reference time-series signal ref[1:0] and the filter output time-series signal tgt[1:0] each from the holding circuit 5, it is unnecessary to require high accuracy, as is required conventionally, of the relationship between the frequency of the reference signal and the cutoff frequency of the analog filter.

Figure 24:
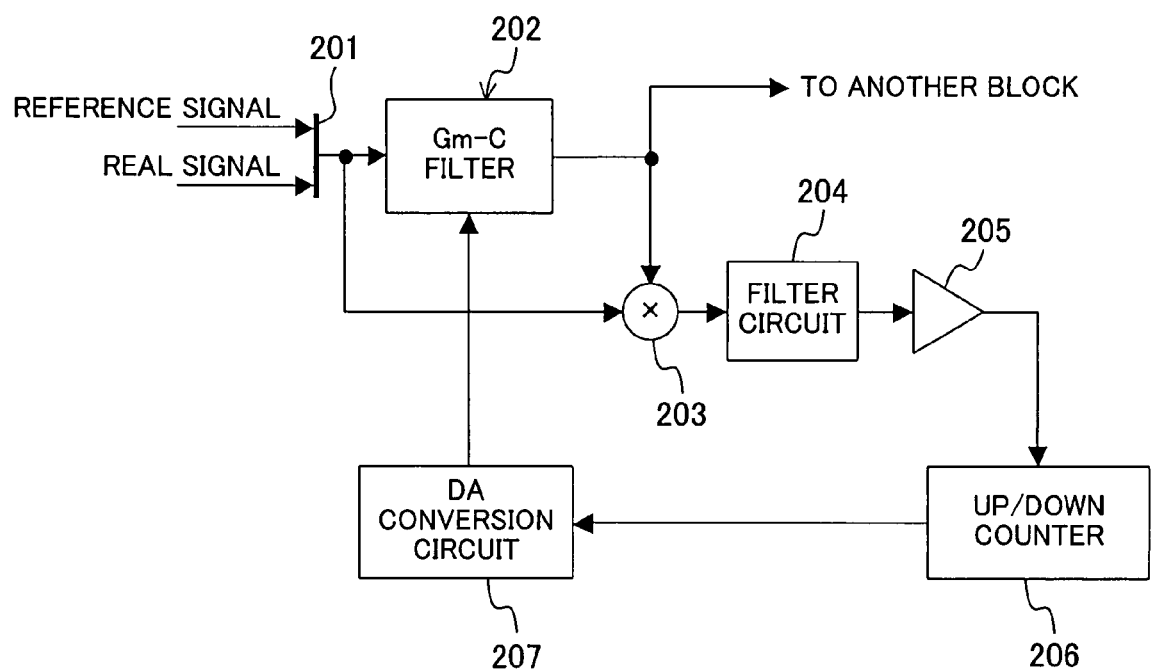
FIG. 24 is a structural view showing an example of a conventional filter adjustment circuit.

Moreover, when the learning of the amount of control is completed, the hold signal generation unit 77 fixes the amount of control in the present embodiment so that there is no incremental/decremental variation in the amount of control. In terms of this point, the conventional technology shown in FIG. 24 has the drawback that the up/down counter 206 constantly repeats incremental/decremental operations during one cycle because, even when the phase difference between the input/output signals of the Gm-C filter 202 has converged to a steady state, the output signal from the multiplier 203 becomes zero on average in one cycle. In addition, even though automatic adjustment is forcibly ended for the prevention of the incremental/decremental variations, an error remains in the up/down counter 206 unless the end timing is precise.

Although the timing generation circuit 6 has generated the update timing signal en based on the both edges of the reference signal RS in the present embodiment, only the rising edge or falling edge of the reference signal RS may be used instead. It is also possible to implement the same function even when the update timing signal en is generated based on only the rising edge or falling edge of the output signal OS from the Gm-C filter 2 or on the both edges thereof.

Although each of the conversion circuits 3 and 4 is composed of the digitization circuit and the holding circuit 5 comprises the 1-bit shift registers 51 to 54 in the present embodiment, the same function can be implemented even when each of the conversion circuits 3 and 4 is composed of an AD converter or the holding circuit 5 is composed of shift registers each in accordance with the bit width of the AD converter.

EMBODIMENT 2

Next, a description will be given to the second embodiment of the present invention.

In Embodiment 1 shown above in FIG. 1, the description has been given to the case where the phase difference between the input/output signals of the Gm-C filter 2 is −180° when the signal having the cutoff frequency fc of the Gm-C filter 2 is inputted to the Gm-C filter 2. In Embodiment 1, the amount of control is updated such that the phase difference between the reference signal RS and the output signal OS of the Gm-C filter 2 is −180° by assuming that the reference signal RS and the input signal IS of the Gm-C filter 2 are exactly identical. However, the update control is possible only in the fourth-order Butterworth filter. Therefore, Embodiment 1 is not applicable to a Gm-C filter in which the phase difference between the input/output signals when the signal having the cutoff frequency is inputted is other than −180°. There can further be expected a situation in which only a signal having a frequency other than the cutoff frequency fc can be inputted as the input to a Gm-C filter.

The present embodiment illustrates the filter adjustment circuit which is also applicable to a Gm-C filter in which the phase difference between the input/output signals is other than −180°.

Figure 11:
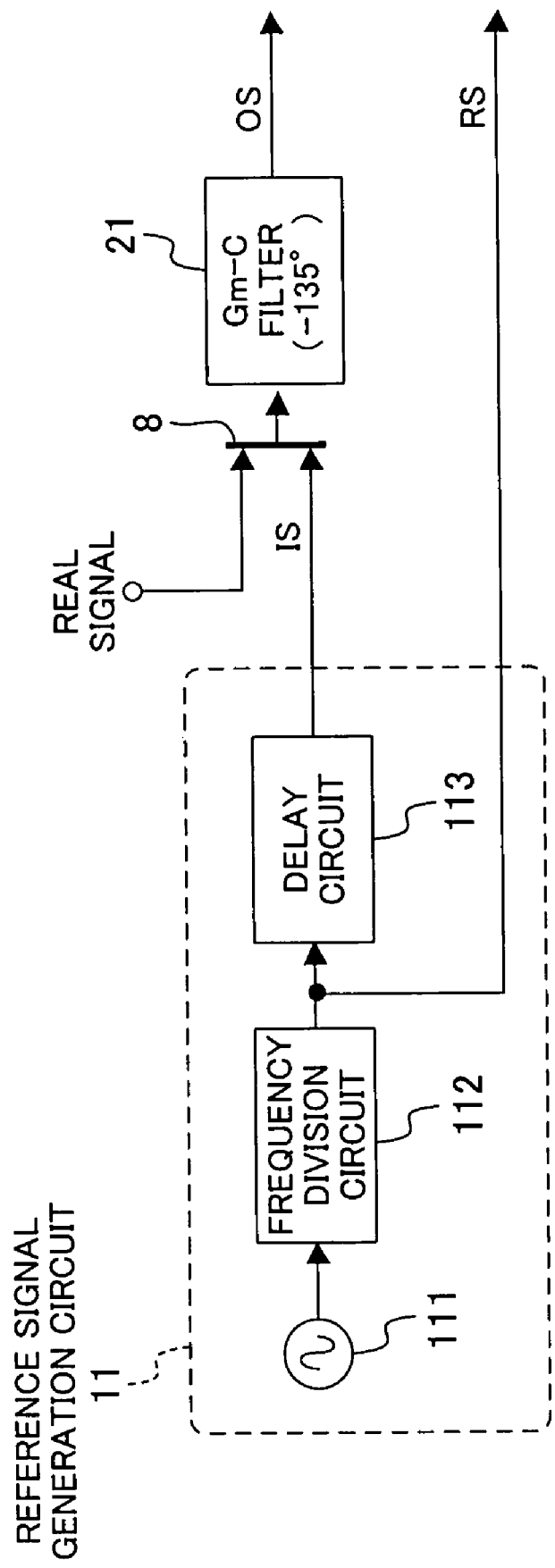
FIG. 11 is a structural view of a reference signal generation circuit and a Gm-C filter each provided in a filter adjustment circuit in Embodiment 2 of the present invention.

FIG. 11 shows the principal portion of the filter adjustment circuit in Embodiment 2, in which a reference signal generation circuit 11 and a Gm-C filter 21 have different structures.

As for the other components, they are the same as shown in FIG. 1 so that the description thereof will be omitted.

In FIG. 11, 21 denotes the Gm-C filter, 11 denotes the reference signal generation circuit, and 8 denotes a selector. In the reference signal generation circuit 11, 111 denotes a reference signal generation circuit for generating a reference signal, 112 denotes a frequency division circuit for dividing the frequency of the reference signal, and 113 denotes a delay circuit for delaying an output signal of the frequency division circuit 122 by a predetermined time. The delay circuit 113 is constituted by a DLL circuit or the like and capable of setting an arbitrary amount of delay to the input signal.

The present embodiment will be described by assuming the case where the design value of the phase difference between the input/output signals of the Gm-C filter 21 when a signal having the cutoff frequency fc is inputted to the Gm-C filter 21 is, e.g., −135°. In the structure of Embodiment 1 described above, the amount of control is adjusted such that the phase difference between the output signal OS of the Gm-C filter 2 and the reference signal RS as the comparison target is −180°. By contrast, in the structure of the present embodiment, the frequency of the reference signal is divided to provide the signal having the cutoff frequency fc in the frequency division circuit 112. The resulting signal is then delayed in the delay circuit 113 by a delay time of −45° (−180°−(−135°)) and the delayed signal is inputted as the input signal IS to the Gm-C filter 21.

Thus, the present embodiment allows filter adjustment independent of the phase difference essentially possessed by the Gm-C filter 21 (phase difference other than −180°) to be performed by only controlling the amount of control such that the phase difference between the output signal OS of the Gm-C filter 21 and the reference signal RS becomes −180°, similarly to Embodiment 1.

Although the present embodiment has placed the delay circuit 113 on a path for generating the input signal IS of the Gm-C filter 21, it will easily be appreciated that the same effects are obtainable even when the delay circuit 113 is placed on a path for generating the reference signal RS.

EMBODIMENT 3

Subsequently, a description will be given the filter adjustment circuit in the third embodiment of the present invention.

In each of the filter adjustment circuits shown above in Embodiments 1 and 2, the phase difference between the output signal OS of the Gm-filter 2 or 21 and the reference signal RS is −180°. When the order of a Gm-C filter is higher, a phase rotation of not less than −360° occurs so that it becomes difficult to correctly perform adjustment in Embodiments 1 and 2. The present embodiment is illustrated as an embodiment which allows excellent filter adjustment to be performed even to a Gm-C filter in which a phase rotation of not less than −360° occurs.

Figure 12:
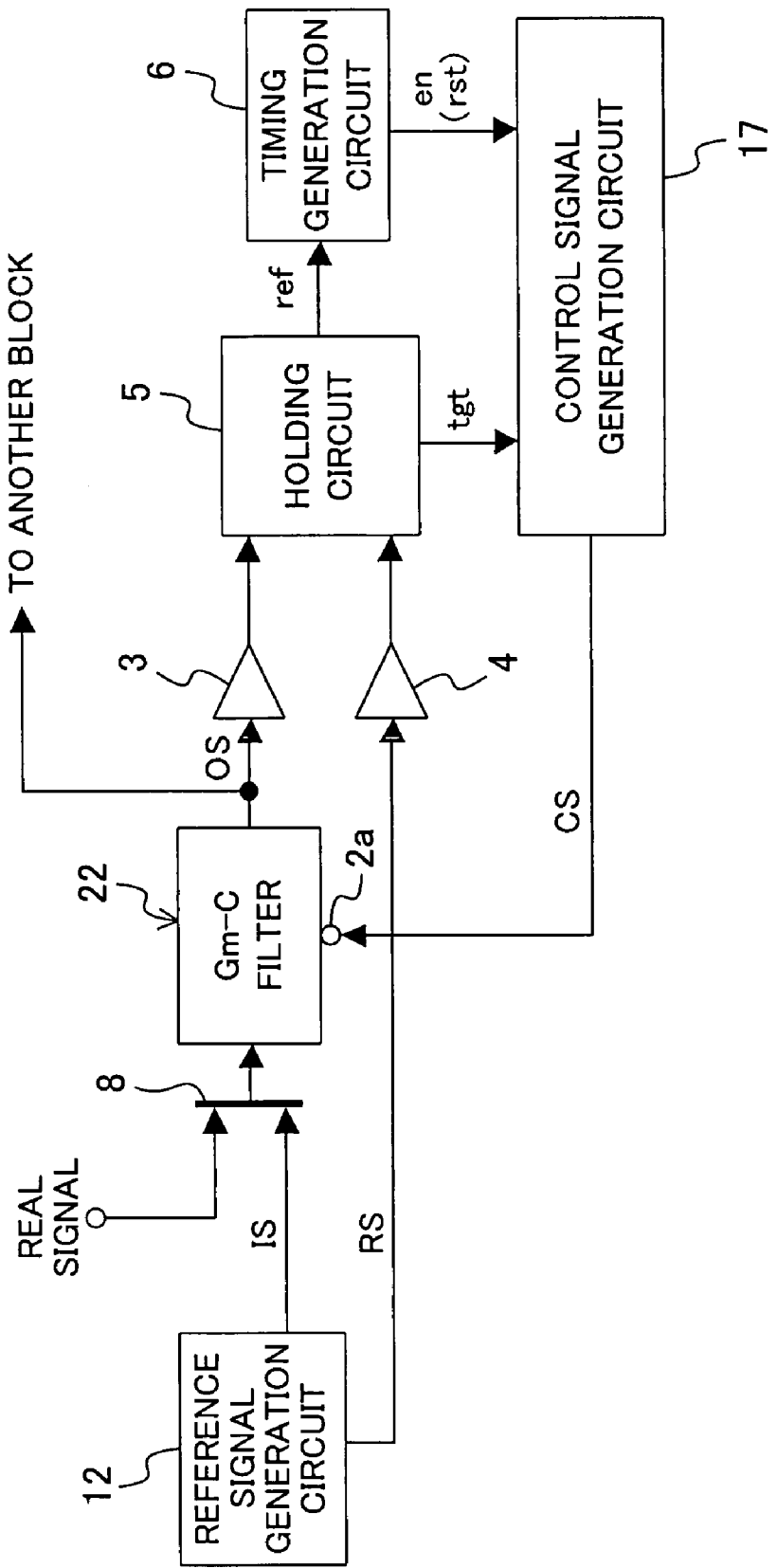
FIG. 12 is an overall structural view of a filter adjustment circuit in Embodiment 3 of the present invention.

FIG. 12 shows the structure of the filter adjustment circuit of the present embodiment. In FIG. 12, the reference signal generation circuit 12, the Gm-C filter 22, and the control signal generation circuit 17 have different internal structures. The Gm-C filter 22 mentioned above is composed of a high-order filter and a phase rotation of, e.g., −360° occurs as a phase characteristic at the cutoff frequency fc.

Figure 13:
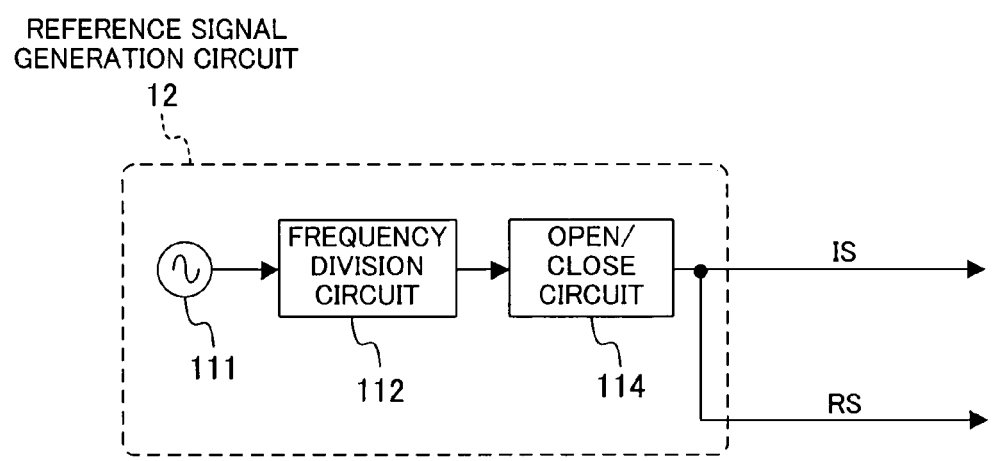
FIG. 13 is a structural view of a reference signal generation circuit provided in the filter adjustment circuit of FIG. 12.
Figure 14:
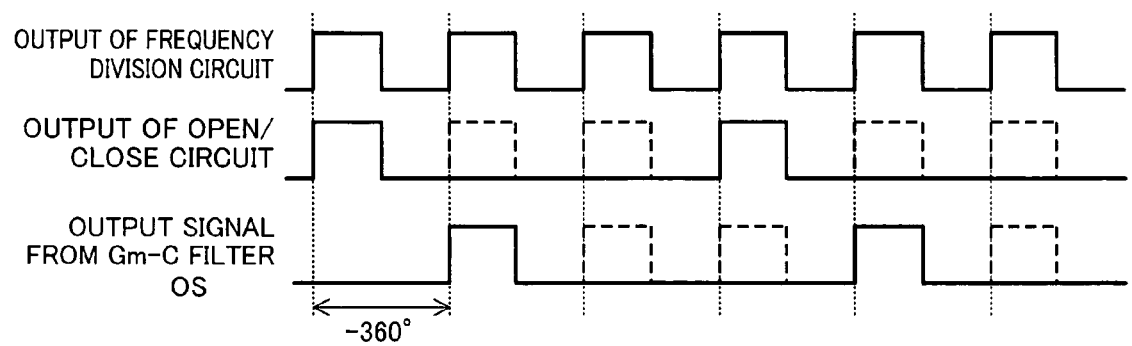
FIG. 14 shows an operation timing chart for the reference signal generation circuit and a Gm-C filter each provided in the filter adjustment circuit of FIG. 12.

FIG. 13 shows the internal structure of the reference signal generation circuit 12. In the reference signal generation circuit 12 of FIG. 13, 111 denotes a reference signal generation circuit, 112 denotes a frequency division circuit for dividing the frequency of the reference signal, and 114 denotes an open/close circuit (intermittent circuit) for intermitting the signal having the frequency divided in the frequency division circuit 112. As shown in FIG. 14, the open/close circuit 114 closes the output signal from the frequency division circuit 112 every three cycles, then permits the output, generates a signal which shifts to the H level every three cycles, and outputs the intermittent signal as the input signal IS to the Gm-C filter 22, while outputting the intermittent signal also as the reference signal RS. Therefore, even when the phase difference between the input/output signals of the Gm-C filter 22 is −360°, it is possible to easily recognize that the output signal OS of the Gm-C filter 22 has the phase difference of −360° between itself and the input signal IS.

Figure 15:
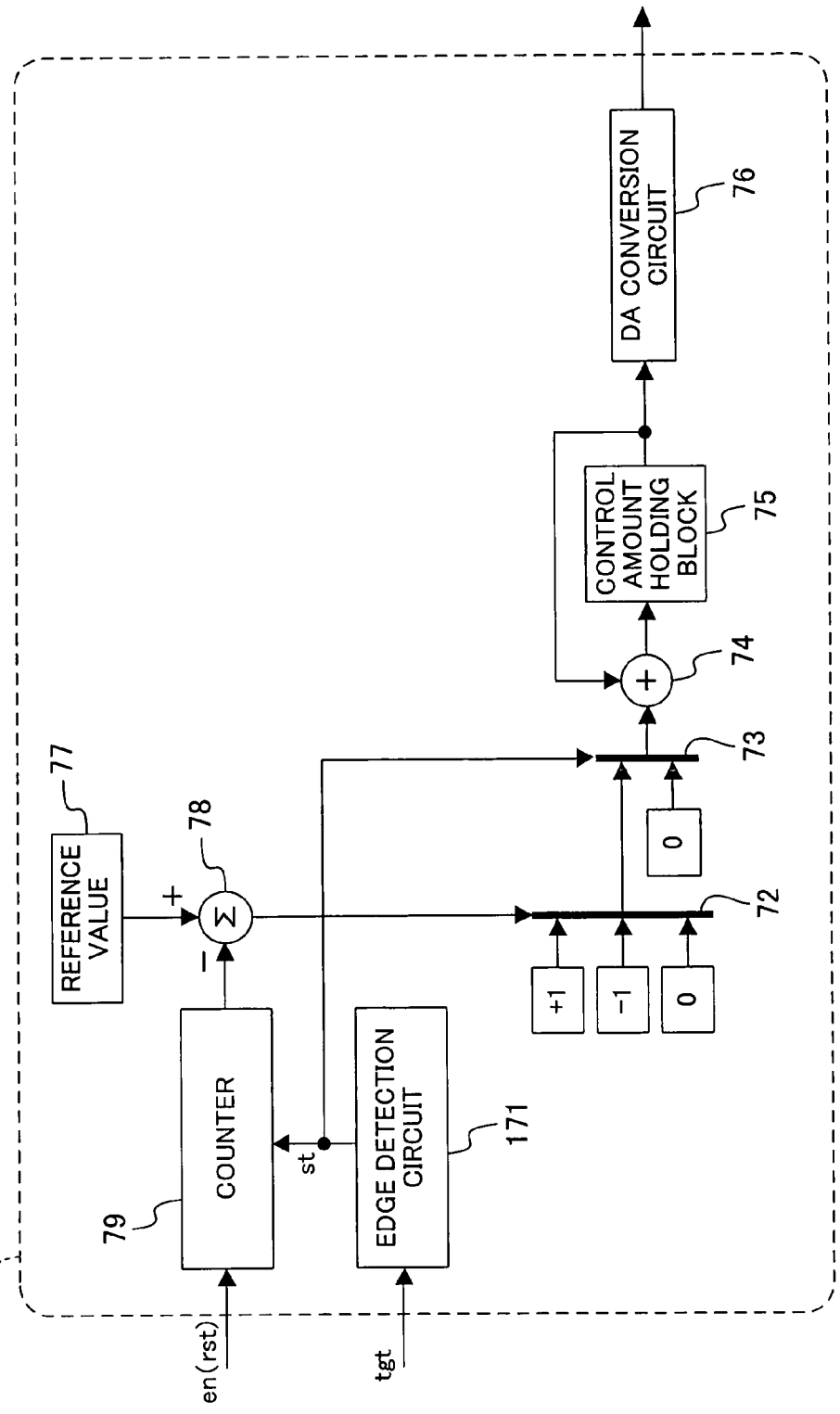
FIG. 15 is a structural view of a control signal generation circuit provided in the filter adjustment circuit of FIG. 12.

Next, the circuit structure of the control signal generation circuit 17 is shown in FIG. 15. To the control signal generation circuit 17 of FIG. 15, only the update timing signal en from the timing generation circuit 6 and the filter output time-series signal tgt from the holding circuit 5 are inputted. In the control signal generation circuit 17, 171 denotes an edge detection circuit which detects a predetermined rising edge or falling edge of the filter output time-series signal tgt from the holding circuit 5 and outputs a stop signal st. 79 denotes a counter which is reset to "0" to resume counting on receiving the update timing signal en generated by the timing generation circuit 6 as a reset signal rst and holds the count value when it receives the stop signal st from the edge detection circuit 171. In other words, the counter 79 detects the edge gap between the reference signal RS and the output signal OS of the Gm-C filter 22. 77 denotes a reference value corresponding to the ideal value (−360°) of the edge gap between the reference signal RS and the output signal OS of the Gm-C filter 22. 78 denotes a subtractor which subtracts the count value of the counter 79 from the reference value 77. 72 denotes a first selector which selects any of the update values "+1", "−1", and "0" based on the result of the subtraction from the subtractor 78 such that the count value of the counter 79 approaches the reference value 77. 73 denotes a second selector which receives the stop signal st from the edge detection circuit 171 mentioned above and selects either of the output of the first selector 72 and the update value "0". 74, 75, and 76 denote the same adder, the same control-amount holding block, and the same DA conversion circuit as described above with reference to FIG. 9.

Thus, the present embodiment recognizes the current phase difference between the reference signal RS and the output signal OS of the Gm-C filter 22 based on the count value of the counter 79 and updates the amount of controlling the transconductance Gm value such that the phase difference coincides with the ideal value (−360°). Therefore, even when the phase characteristic at the cutoff frequency fc is not less than −360°, filter adjustment can be performed with high accuracy.

EMBODIMENT 4

Next, a description will be given to the filter adjustment circuit in Embodiment 4 of the present invention.

Figure 16:
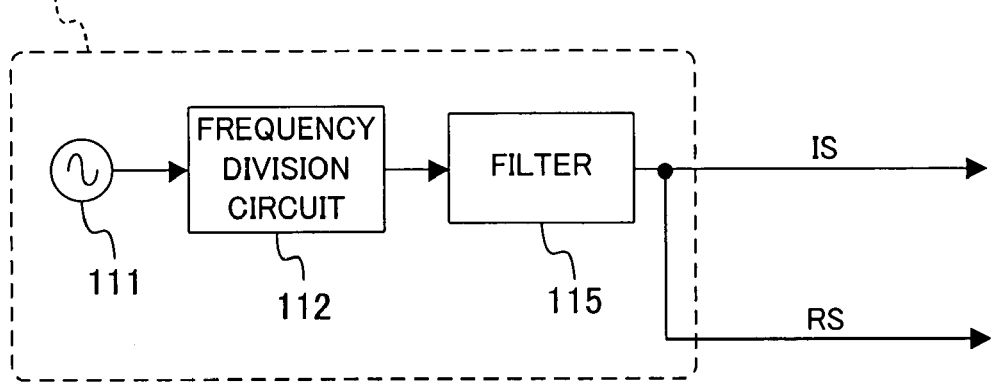
FIG. 16 is a structural view of a reference signal generation circuit provided in a filter adjustment circuit in Embodiment 4 of the present invention.

FIG. 16 shows the internal structure of a reference signal generation circuit 13 provided in the filter adjustment circuit of Embodiment 4. As for the other components, they are the same as shown in FIG. 1 so that the description thereof will be omitted.

In the reference signal generation circuit 13 of FIG. 16, a filter circuit (waveform shaping circuit) 115 is placed in a stage subsequent to the frequency division circuit 112 for dividing the frequency of the reference signal from the reference signal generation circuit 111. The filter circuit 115 is composed of, e.g., an RC lowpass filter. When the frequency divided signal from the frequency division circuit 112 is a rectangular wave, the filter circuit 115 has the RC time constant thereof determined in accordance with the frequency of the frequency divided signal and blunts the edges of the waveform of the frequency divided signal. The signal having the waveform with the blunt edges serves as the input signal IS to the Gm-C filter 2 and also as the reference signal RS.

Thus, in the present embodiment, changes in the input signal IS to the Cm-C filter 2 and the reference signal RS are gradual and not abrupt. As a result, when the output signal from the Gm-C filter 2 and the reference signal RS are digitized in the conversion circuits 3 and 4, the digitization can be correctly performed and a conversion mismatch in digitization can be reduced.

EMBODIMENT 5

Subsequently, a description will be given to the filter adjustment circuit in Embodiment 5 of the present invention.

The present embodiment relates to measures to be taken when the value of the transconductance Gm of a Gm-C filter is updated and waveform distortion resulting from the update occurs thereafter in the output signal OS of a Gm-C filter.

Figure 17:
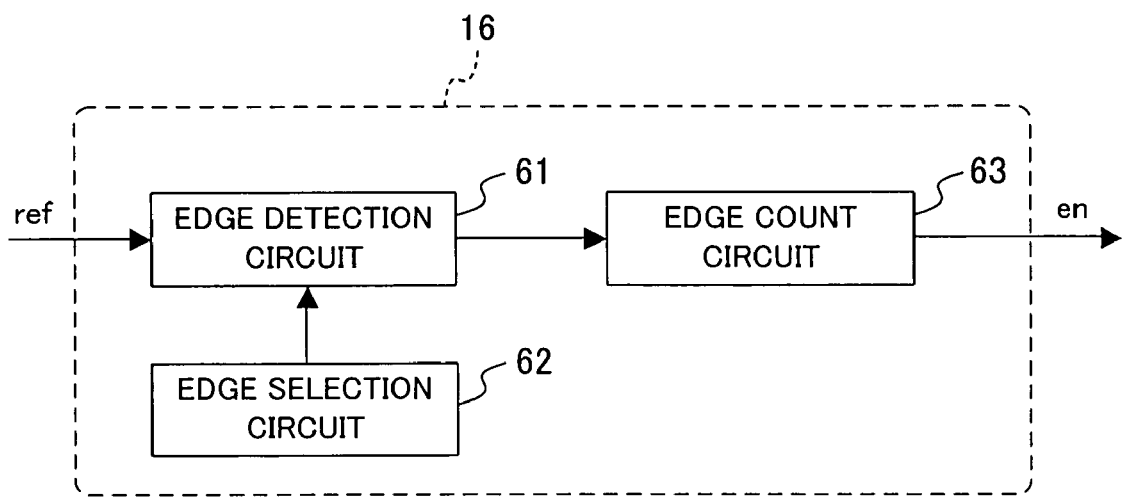
FIG. 17 is a structural view of a timing generation circuit provided in a filter adjustment circuit in Embodiment 5 of the present invention.

The overall structure of the filter adjustment circuit of the present embodiment is the same as in FIG. 1. In the present embodiment, the timing generation circuit 6 of FIG. 1 is modified. FIG. 17 shows a timing generation circuit of the present embodiment. The timing generation circuit 16 of FIG. 17 further has an edge count circuit 63 in addition to the internal structure of the timing generation circuit 6 shown in FIG. 7. The edge count circuit 63 counts the number of the rising edges and falling edges of the reference signal RS outputted from the edge detection circuit 61 based on the reference time-series signal ref and generates and outputs the update timing signal en with an edge detection timing after counting a preset number of times (e.g., twice). The set number of times (twice) is the number of counted edges corresponding to a time after the value of the transconductance Gm is updated till the waveform distortion in the output signal OS of the Gm-C filter resulting from the update disappears.

Figure 18:
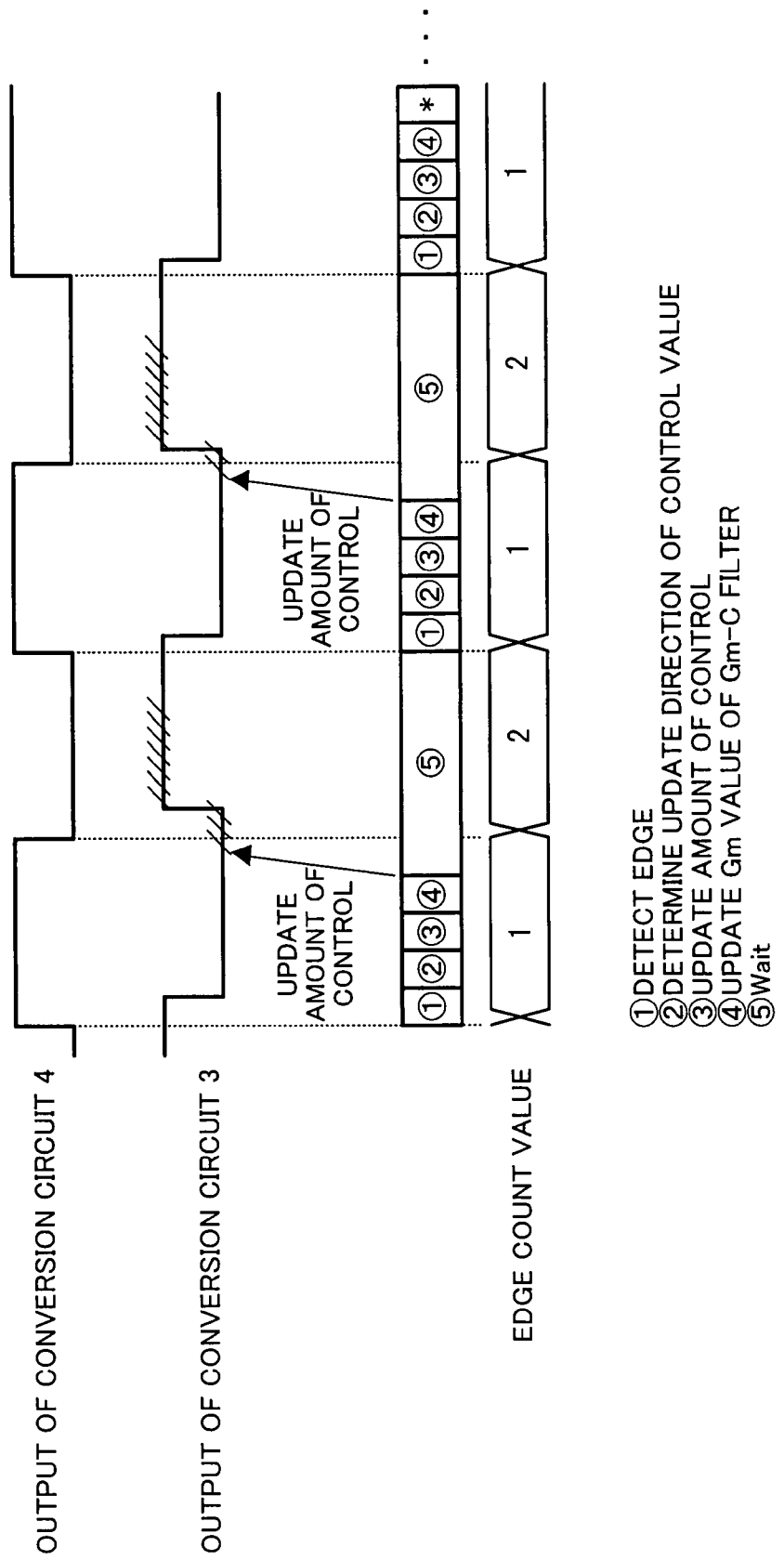
FIG. 18 shows an operation timing chart for the filter adjustment circuit of FIG. 17.

Thus, in the present embodiment, the output signal OS of the Gm-C filter 2 varies within the time zone indicated by the hatched line in FIG. 18 after the result of updating the transconductance Gm value is reflected, as shown in FIG. 18. However, since it is possible to set a wait period till the variation converges to a steady state with the number of edges counted by the edge count circuit (generation cycle setting means for arbitrarily setting the generation cycle of the update timing signal en) 63, the misoperation of the filter adjustment circuit can be circumvented.

EMBODIMENT 6

A description will be further given to the filter adjustment circuit in Embodiment 6 of the present invention.

Figure 19:
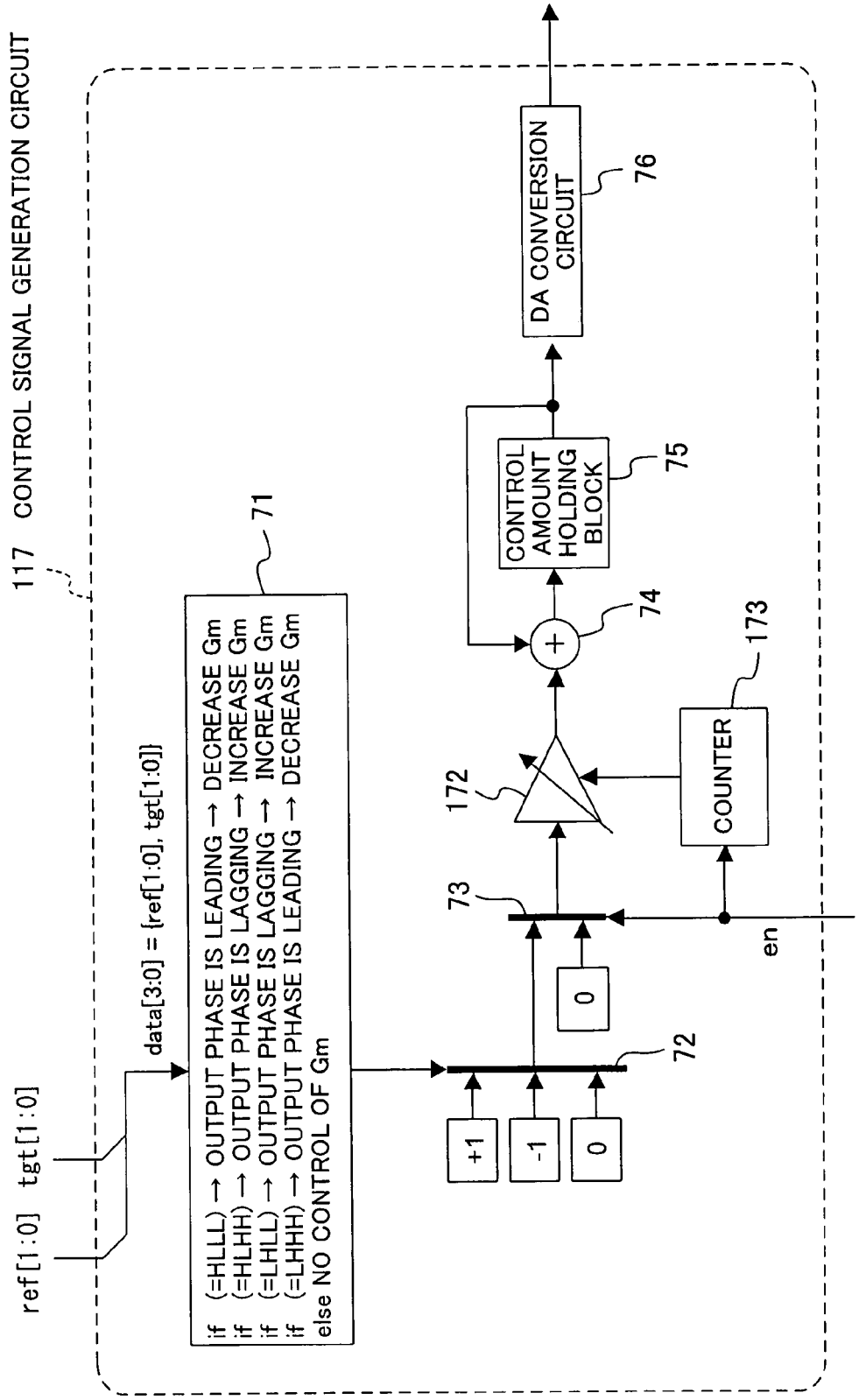
FIG. 19 is a structural view of a control signal generation circuit provided in a filter adjustment circuit in Embodiment 6 of the present invention.

FIG. 19 shows the internal structure of a control signal generation circuit 117 provided in the filter adjustment circuit of the present embodiment. As for the overall structure, it is the same as in FIG. 1 so that the description thereof will be omitted.

The control signal generation circuit 117 of FIG. 19 further has a gain adjustment unit 172 and a counter 173 in addition to the control signal generation circuit 7 shown in FIG. 9. In FIG. 19, the depiction of the hold signal generation unit 77 shown in FIG. 9 is omitted.

The counter 173 counts the number of times the update timing signal en is outputted from the timing generation circuit 6. The gain adjustment unit 172 adjusts the gain in accordance with the count value of the counter 173. The gain adjustment unit 172 sets the gain to a large value when the count value of the counter 173 is small and sets the gain to a smaller value as the count value is larger. For example, when the control-amount holding block 75 has a 4-bit configuration and when the count value is "0", "1", "2", or "3", the gain is set to "8", "4", "2", or "1".

Thus, in the present embodiment, the value of the transconductance Gm can be updated in accordance with the number of times the update timing signal en is outputted from the timing generation circuit 6. At first, the value of the transconductance Gm can be updated with the large gain and then, as filter adjustment proceeds, the value of the transconductance Gm can be updated with accuracy with the small gain. Therefore, the filter adjustment can be performed with accuracy in a short time.

EMBODIMENT 7

Next, a description will be given to the filter adjustment circuit in Embodiment 7 of the present invention.

Figure 20:
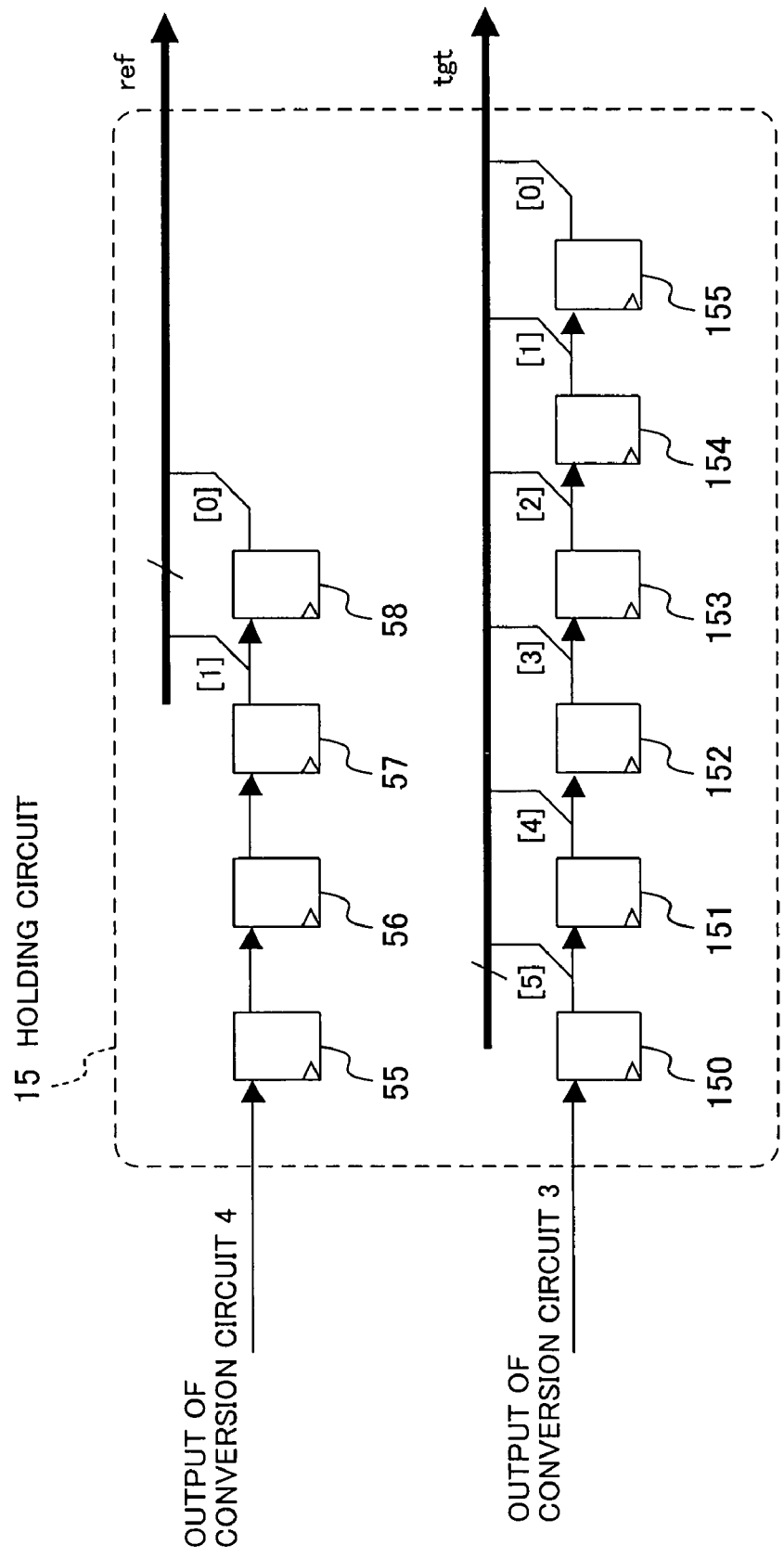
FIG. 20 is a structural view of a holding circuit provided in a filter adjustment circuit in Embodiment 7 of the present invention.

FIG. 20 shows the internal structure of a holding circuit 15 provided in the filter adjustment circuit of the present embodiment. As for the overall structure, it is the same as in FIG. 1 so that the description thereof will be omitted.

In the holding circuit 15 shown in FIG. 20, when two signals in accordance with amplitude values from the conversion circuits 3 and 4 are held in time series, four 1-bit registers 55 to 58 are used to hold the reference signal from the conversion circuit 4 in time series and six 1-bit registers 150 to 155 are used to hold the filter output signal from the conversion circuit 3 in time series.

Figure 8:
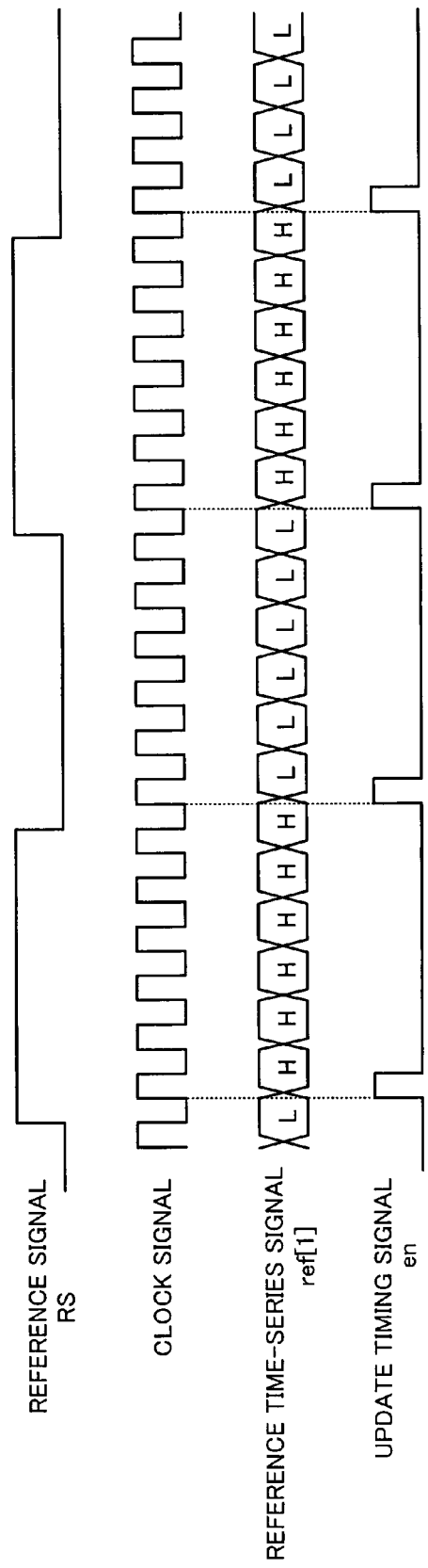
FIG. 8 shows an operation timing chart for the timing generation circuit of FIG. 7.
Figure 21:
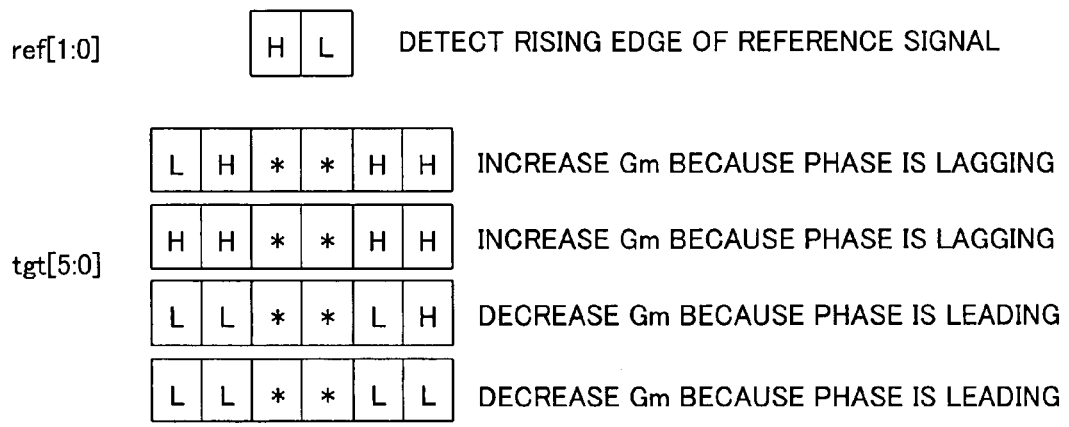
FIG. 21 is a view showing two time-series signals based on which the generation of a control signal is determined in a control signal generation circuit provided in the filter adjustment circuit of FIG. 20 and an insensitive zone.

In the increase/decrease direction determination circuit 71 (see FIG. 9) of the control signal generation circuit 7, the increase/decrease direction of the amount of control on the Gm-C filter 2 is determined as shown in FIG. 21. Specifically, the time zone when the amplitude value of the reference time-series signal ref[1:0] changes (FIG. 21 illustrates a L-to-H change), i.e., when the update timing signal en is outputted, as can be seen from FIG. 8, is provided as an insensitive zone and the amplitude value of the filter output time-series signal tgt during the period is excluded from a subject based on which the generation of the control signal CS is determined, as indicated by the marks * in FIG. 21, so that the increase/decrease direction of the amount of control on the Gm-C filter 2 is determined from the amplitude value except for the insensitive zone.

Thus, in the present embodiment, it is possible to determine the increase/decrease direction of the amount of control with high accuracy even though a slight amplitude change in a part of the filter output time-series signal tgt cannot be correctly stored in the 1-bit shift registers 152 and 153 when the amplitude value of the reference time-series signal ref[1:0] changes. This allows more flexible filter adjustment of the Gm-C filter 2.

EMBODIMENT 8

Subsequently, a description will be given to the filter adjustment circuit in Embodiment 8 of the present invention.

In Embodiment 1 described above, the frequency of the clock signal for driving the holding circuit 5 and the digital circuits subsequent thereto is set to a value sufficiently higher than the cutoff frequency fc of the Gm-C filter 2. In the present embodiment, by contrast, the frequency of the clock signal is set in accordance with the frequency of the input signal inputted to the Gm-C filter 2 and with accuracy required of filter adjustment. The clock signal is generated based on a reference signal generated by, e.g., the reference signal generation circuit 111 shown in FIG. 13.

As a result, the present embodiment allows optimization of the filter adjustment circuit.

EMBODIMENT 9

Next, a description will be given to the filter adjustment circuit in Embodiment 9 of the present invention.

In the description given above, it is assumed that the structure of the Gm-C filter when the filter adjustment is performed is entirely identical to that when a normal operation which processes real signals is performed thereafter. The present embodiment relates to the case where the Gm-C filter is switched between different structures when the filter adjustment is performed and when real signals are processed.

Figure 22:
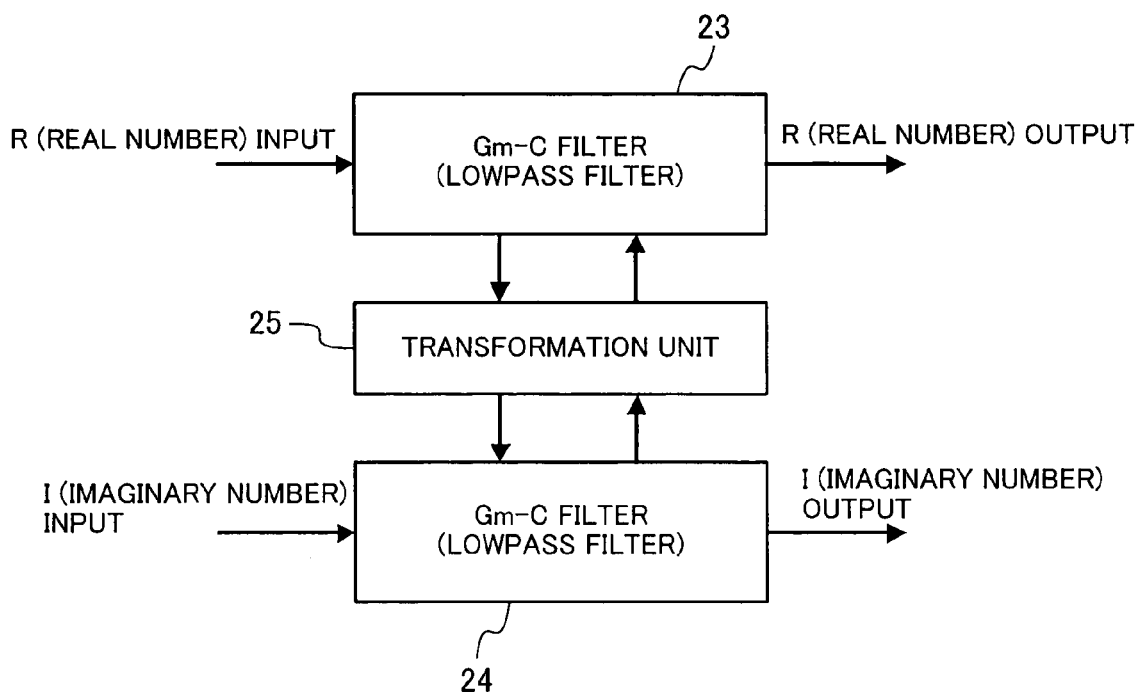
FIG. 22 is a structural view of a Gm-C filter as a target of adjustment by a filter adjustment circuit in Embodiment 9 of the present invention.

The present invention will describe the case where the Gm-C filter is a complex filter. The complex filter is characterized in that it can handle the concept of positive and negative frequencies thereof into respective real parts and imaginary parts. FIG. 22 shows a bandpass filter constituting the complex filter as the target of filter adjustment in the present embodiment. The bandpass filter comprises two complementary Gm-C lowpass filters 23 and 24 and an ideal transformer 25 coupling the Gm-C lowpass filters 23 and 24 and implements a bandpass filter in accordance with the phase difference between an R (real number) input and an I (imaginary number) input.

To directly adjust the response characteristics of the complex filter shown in FIG. 22, extremely complicated control is needed. Therefore, in performing filter adjustment, the present embodiment modifies the structure such that only either one (partial filter unit, e.g., 23) of the Gm-C lowpass filters constituting the complex filter is independent. Then, filter adjustment using the filter adjustment circuit shown in FIG. 1 is performed only to the independent Gm-C lowpass filter 23 as the target of filter adjustment.

Thus, the present embodiment allows easier and more effective filter adjustment than in the case where filter adjustment is performed with respect to the entire complex filter shown in FIG. 22.

EMBODIMENT 10

Subsequently, a description will be given to the filter adjustment circuit in Embodiment 10 of the present invention.

Figure 23:
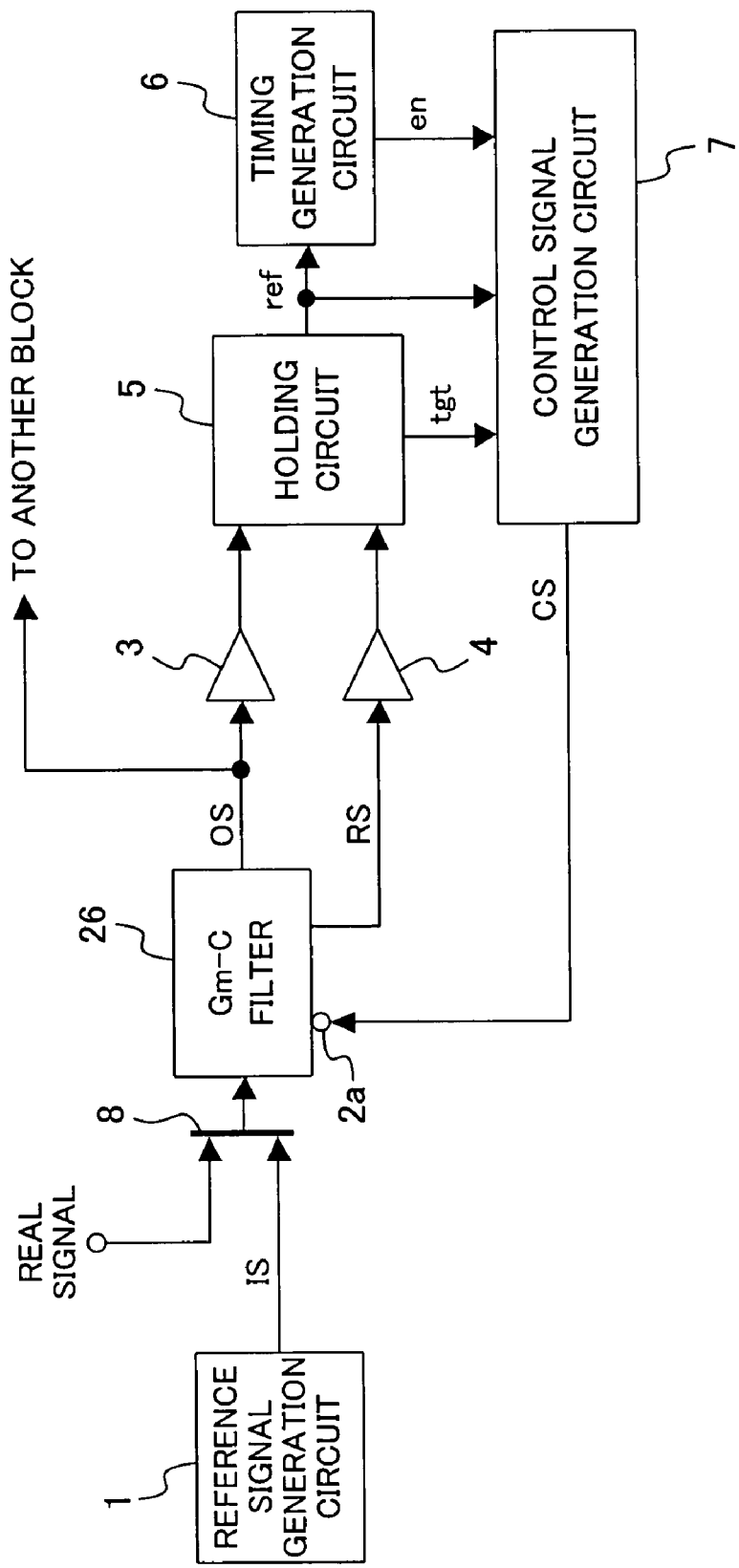
FIG. 23 is an overall structural view of a filter adjustment circuit in Embodiment 10 of the present invention.

FIG. 23 shows the overall structure of the filter adjustment circuit of the present embodiment. In the filter adjustment circuit of FIG. 23, the reference signal generation circuit 1 generates only the input signal IS without generating a reference signal. Instead, a signal from a predetermined internal node in a Gm-C filter 26 is used as the reference signal RS. For example, in the case where the Gm-C filter 26 is composed of two second-order filters connected in series, a signal from the output node (predetermined internal node) of the second-order filter in the first stage may be used as the reference signal RS.

In the description given above, the Gm-C filter has thus been illustrated as an example of the analog filter circuit. However, it will easily be appreciated that the present invention is applicable to any analog filter circuit provided that is includes an analog amplifier such as an operational amplifier.

In the description given above, the timing generation circuit 6 has generated the update timing signal en based on the reference time-series signal ref from the holding circuit 5. However, it will easily be appreciated that the update timing signal en may also be generated based on the filter output time-series signal tgt from the holding circuit 5.

In the description given above, the two conversion circuits 3 and 4 have digitized the output signal OS from the Gm-C filter 2 and the reference signal RS from the reference signal generation circuit 1, respectively. However, it will easily be appreciated that the output signal OS and the reference signal RS may also be quantized to multi-value signals.

INDUSTRIAL APPLICABILITY

As described above, the present invention allows an error in the response characteristics of an analog filter circuit resulting from variations in fabrication process to be adjusted with a relatively simple circuit structure. Therefore, a filter adjustment circuit according to the present invention is useful as a response characteristic adjustment circuit for an analog filter circuit and applicable to system LSIs in general which require analog filter circuits, such as a wireless LSI for, e.g., a Bluetooth system and the LSI of a DVD.

The invention claimed is:

1. A filter adjustment circuit for adjusting response characteristics of an analog filter circuit having an analog amplifier capable of variably adjusting a gain in accordance with a value of a control signal inputted to a control terminal, the filter adjustment circuit comprising:
   reference signal generating means for generating an input signal to be inputted to the analog filter circuit and a reference signal as a comparison target and outputting the input signal and the reference signal;
   converting means for converting an output signal from the analog filter circuit operating on receiving the input signal and the reference signal from the reference signal generating means to signals in accordance with respective amplitude values of these signals;
   holding means for holding the two output signals from the converting means in time series;
   timing generating means for generating an update timing signal indicative of an update timing of the control signal to be inputted to the control terminal of the analog filter circuit based on a state transition of a filter output time-series signal held in the holding means or on a state transition of a reference time-series signal held in the holding means; and
   a control signal generating means for receiving the filter output time-series signal and the reference time-series signal each held in the holding means as well as the update timing signal from the timing generating means, generating the control signal to be inputted to the control terminal of the analog filter circuit based on a state of the received filter output time-series signal and on a state of the received reference time-series signal, and outputting the control signal to the analog filter circuit in accordance with a reception timing of the update timing signal.

2. The filter adjustment circuit of claim 1, wherein the reference signal generating means comprises a frequency division circuit for receiving a predetermined reference signal and dividing a frequency of the reference signal to generate the input signal to the analog filter circuit and the reference signal as the comparison target.

3. The filter adjustment circuit of claim 1, wherein
   the reference signal generating means comprises a delay circuit disposed in either of the input signal to the analog filter circuit and the reference signal as the comparison target to delay the input signal or the reference signal by a predetermined phase.

4. The filter adjustment circuit of claim 1, wherein the reference signal generating means comprises an intermittent circuit for receiving a specified reference signal and intermitting the reference signal for a predetermined time to generate the intermittent input signal to the analog filter and the intermittent reference signal as the comparison target.

5. The filter adjustment circuit of claim 1, wherein the reference signal generating means comprises a waveform shaping circuit for receiving a specified reference signal and delaying a change in the reference signal to generate the input signal to the analog filter circuit showing the delayed change as well as the reference signal as the comparison target showing the delayed change.

6. The filter adjustment circuit of claim 1, wherein the reference signal generating means generates the input signal to the analog filter circuit and the reference signal as the comparison target as identical signals.

7. The filter adjustment circuit of claim 1, wherein the reference signal generating means comprises at least two of the frequency division circuit of claim 2, the delay circuit of claim 3, the intermittent circuit of claim 4, and the waveform shaping circuit of claim 5.

8. The filter adjustment circuit of claim 1, wherein the analog filter circuit has only a predetermined part of a filter portion thereof used during the adjustment of the response characteristics thereof.

9. The filter adjustment circuit of claim 1, wherein the converting means digitizes each of the output signal from the analog filter circuit and the reference signal and outputs the digitized output signal and the digitized reference signal.

10. The filter adjustment circuit of claim 1, wherein the converting means quantizes and converts each of the output signal from the analog filter circuit and the reference signal to a multi-value signal and outputs the multi-value signals.

11. The filter adjustment circuit of claim 1, wherein the holding means holds each of a time-series signal in accordance with the amplitude value of the output signal from the analog filter circuit held in the converting means and a time-series signal in accordance with the amplitude value of the reference signal from the reference signal generating means at 2 or more points.

12. The filter adjustment circuit of claim 1, wherein the timing generating means detects a rising edge of the reference time-series signal held in the holding means and generates the update timing signal upon detecting the rising edge.

13. The filter adjustment circuit of claim 1, wherein the timing generating means detects a falling edge of the reference time-series signal held in the holding means and generates the update timing signal upon detecting the falling edge.

14. The filter adjustment circuit of claim 1, wherein the timing generating means detects rising edges and falling edges of the reference time-series signal held in the holding means and generates the update timing signal upon detecting each of the rising edges and the falling edges.

15. The filter adjustment circuit of claim 1, wherein the timing generating means detects a rising edge of the filter output time-series signal held in the holding means and generates the update timing signal upon detecting the rising edge.

16. The filter adjustment circuit of claim 1, wherein the timing generating means detects a falling edge of the filter output time-series signal held in the holding means and generates the update timing signal upon detecting the falling edge.

17. The filter adjustment circuit of claim 1, wherein the timing generating means detects rising edges and a falling edges of the filter output time-series signal held in the holding means and generates the update timing signal upon detecting each of the rising edges and the falling edges.

18. The filter adjustment circuit of claim 1, wherein the timing generating means comprises generation cycle setting means for setting a generation cycle of the update timing signal to an arbitrary given cycle.

19. The filter adjustment circuit of claim 1, wherein the control signal generating means updates the control signal to be inputted to the control terminal of the analog filter circuit on each reception timing of the update timing signal from the timing generating means.

20. The filter adjustment circuit of claim 1, wherein the control signal generating means changes a gain of the control signal to be generated in accordance with the number of times the update timing signal is outputted from the timing generating means.

21. The filter adjustment circuit of claim 1, wherein the control signal generating means provides a predetermined time zone including a reception time of the update timing signal from the timing generating means as an insensitive zone in at least one of the two time-series signals received from the holding means and excludes a time-series signal value included in the insensitive zone from a subject based on which the generation of the control signal is determined.

22. The filter adjustment circuit of claim 1, wherein
each or any of the converting means, the holding means, the timing generating means, and the control signal generating means operates in response to a clock signal and
a frequency of the clock signal is sufficiently higher than a frequency of the output signal from the analog filter circuit to ensure a low noise property.

23. The filter adjustment circuit of claim 1, wherein the converting means receives a signal extracted from a predetermined internal node in the analog filter circuit as a reference signal instead of receiving the reference signal generated by the reference signal generating means.

* * * * *